(12) United States Patent
Kim et al.

(10) Patent No.: US 12,557,520 B2
(45) Date of Patent: Feb. 17, 2026

(54) DISPLAY DEVICE INCLUDING A PLURALITY OF COLOR PATTERNS

(71) Applicant: Samsung Display Co., LTD., Yongin-si (KR)

(72) Inventors: Su Jeong Kim, Yongin-si (KR); Jina Seo, Yongin-si (KR); Yun Ho Lee, Yongin-si (KR); Eunbee Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 277 days.

(21) Appl. No.: 18/206,369

(22) Filed: Jun. 6, 2023

(65) Prior Publication Data

US 2024/0065068 A1 Feb. 22, 2024

(30) Foreign Application Priority Data

Aug. 17, 2022 (KR) .......................... 10-2022-0102829

(51) Int. Cl.
*H10K 59/38* (2023.01)
*H10K 59/80* (2023.01)

(52) U.S. Cl.
CPC .......... *H10K 59/38* (2023.02); *H10K 59/873* (2023.02); *H10K 59/8792* (2023.02)

(58) Field of Classification Search
CPC . G06F 3/0412; G06F 3/0448; H01L 25/0753; H10D 86/451; H10H 20/851; H10H 20/8511; H10H 20/8514; H10H 20/852; H10H 20/855; H10H 20/856; H10H 29/011; H10H 29/14; H10H 29/142; H10H 29/30; H10H 29/32; H10H 29/34; H10H 29/345; H10H 29/352; H10H 29/37; H10H 29/39; H10H 29/41; H10H 29/45; H10H 29/49; H10H 29/851; H10H 29/8511; H10H 29/8514; H10H 29/8517; H10H 29/852; H10H 29/855; H10H 29/8552;

(Continued)

(56) References Cited

U.S. PATENT DOCUMENTS

2021/0126056 A1* 4/2021 Kim ..................... H10K 59/879

FOREIGN PATENT DOCUMENTS

KR 1020180011925 A 2/2018
KR 1020180047559 A 5/2018

(Continued)

*Primary Examiner* — Cheung Lee
(74) *Attorney, Agent, or Firm* — CANTOR COLBURN LLP

(57) ABSTRACT

A display device includes a substrate, first to third light emitting devices disposed on a substrate and spaced apart from each other, an encapsulation layer covering the first to third light emitting devices, a light blocking member disposed on an encapsulation layer and defining first to third openings corresponding to the first to third light emitting devices, respectively, a color filter layer including first to third color filters disposed in the first to third openings, respectively, a first color pattern disposed in the first opening, covered by the first color filter, and including a same material as the second color filter or a same material as the third color filter, and a second color pattern disposed in the second opening, covered by the second color filter, and including a same material as the first color filter or the same material as the third color filter.

20 Claims, 17 Drawing Sheets

(58) Field of Classification Search
CPC .. H10H 29/922; H10H 29/962; H10K 59/352; H10K 59/38; H10K 59/40; H10K 59/873; H10K 59/8792
See application file for complete search history.

(56) References Cited

FOREIGN PATENT DOCUMENTS

| | | | |
|---|---|---|---|
| KR | 1020200083745 A | 7/2020 | |
| KR | 1020220003687 A | 1/2022 | |

* cited by examiner

FIG. 2
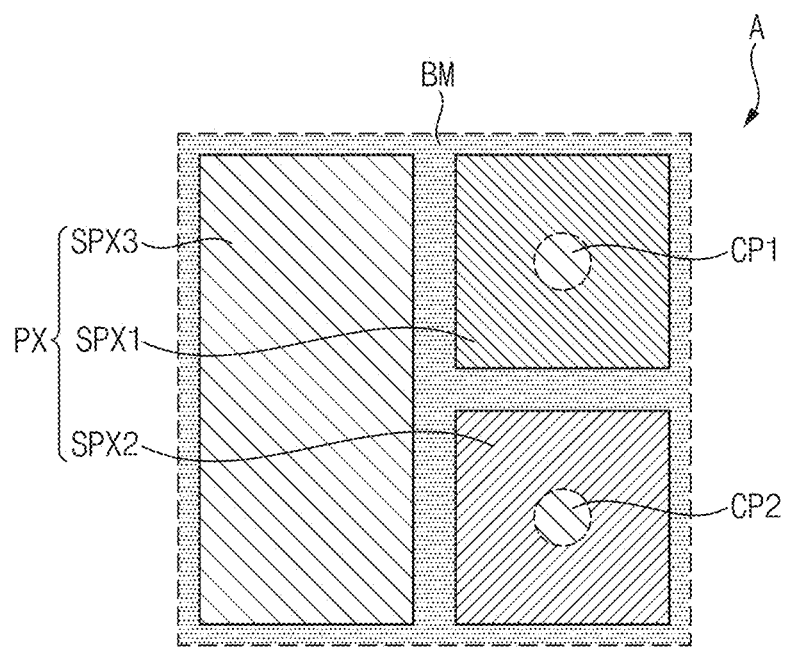
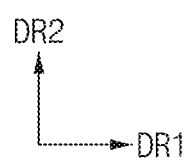

DISPLAY DEVICE INCLUDING A PLURALITY OF COLOR PATTERNS

This application claims priority to Korean Patent Application No. 10-2022-0102829, filed on Aug. 17, 2022, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

As a display device typically includes wires and electrodes including metal, external light incident on the display device may be reflected by the wires and electrodes such that display quality of an image display by the display device may be degraded by the reflected external light. Accordingly, the display device may include a polarizing plate to prevent reflection by external light.

SUMMARY

In a display device including a polarizing plate to prevent reflection by external light, a light efficiency of the display device may be reduced due to the polarizing plate.

Embodiments provide a display device with improved display quality.

A display device according to an embodiment includes a substrate, a first light emitting device, a second light emitting device and a third light emitting device, which are disposed on the substrate and spaced apart from each other, an encapsulation layer covering the first light emitting device, the second light emitting device and the third light emitting device, a light blocking member disposed on the encapsulation layer, where light blocking member defines a first opening corresponding to the first light emitting device, a second opening corresponding to the second light emitting device, and a third opening corresponding to the third light emitting device, a color filter layer including a first color filter disposed in the first opening, a second color filter disposed in the second opening, and a third color filter disposed in the third opening, a first color pattern disposed in the first opening and covered by the first color filter, where the first color pattern includes at least one selected from a same material as the second color filter and a same material as the third color filter, and a second color pattern disposed in the second opening and covered by the second color filter, where the second color pattern includes at least one selected from a same material as the first color filter and the same material as the third color filter.

In an embodiment, the first color filter may be a red color filter which selectively transmits a red light, the second color filter may be a green color filter which selectively transmits a green light, and the third color filter may be a blue color filter which selectively transmits a blue light.

In an embodiment, a planar shape of each of the first color pattern and the second color pattern may be circular, elliptical, polygonal, rhombic, or track-shaped. In an embodiment, the first color pattern may include a lower color pattern and an upper color pattern disposed on the lower color pattern, one of the lower color pattern and the upper color pattern may include the same material as the third color filter, and the other of the lower color pattern and the upper color pattern may include the same material as the second color filter.

In an embodiment, the second color pattern may include a lower color pattern and an upper color pattern disposed on the lower color pattern, one of the lower color pattern and the upper color pattern may include the same material as the third color filter and the other of the lower color pattern and the upper color pattern may include the same material as the first color filter.

In an embodiment, the display device may further include a light blocking pattern disposed in the third opening and covered by the third color filter.

In an embodiment, the light blocking pattern may include a same material as the light blocking member.

In an embodiment, the light blocking pattern may include at least one selected from the same material as the first color filter and the same material as the second color filter.

In an embodiment, the light blocking pattern may include a lower light blocking pattern and an upper light blocking pattern disposed on the lower light blocking pattern, one of the lower light blocking pattern and the upper light blocking pattern may include the same material as the first color filter, and the other of the lower light blocking pattern and the upper light blocking pattern may include the same material as the second color filter.

In an embodiment, the display device may further include a first touch electrode disposed on the encapsulation layer, a touch insulating layer covering the first touch electrode, where a trench may be defined on the touch insulating layer to overlap the first color pattern and the second color pattern, a second touch electrode disposed on the touch insulating layer and overlapping the first touch electrode, and a reflective pattern disposed in the trench of the touch insulating layer and overlapping the first color pattern and the second color pattern.

In an embodiment, the reflective pattern may include a same material as the second touch electrode.

A display device according to an embodiment includes a substrate, a first light emitting device, a second light emitting device and a third light emitting device, which are disposed on the substrate and spaced apart from each other, an encapsulation layer covering the first light emitting device, the second light emitting device and the third light emitting device, a light blocking member disposed on the encapsulation layer, where the light blocking member defines a first opening corresponding to the first light emitting device, a second opening corresponding to the second light emitting device, and a third opening corresponding to the third light emitting device, a color filter layer including a first color filter disposed in the first opening, a second color filter disposed in the second opening, and a third color filter disposed in the third opening, and a color pattern disposed in the first opening and covered by the first color filter, where the color pattern includes at least one selected from a same material as the second color filter and a same material as the third color filter In an embodiment, one of the first color filter and the second color filter may be a red color filter which selectively transmits a red light, the other of the first color filter and the second color filter may be a green color filter which selectively transmits a green light, and the third color filter may be a blue color filter which selectively transmits a blue light.

In an embodiment, a planar shape of the color pattern may be circular, elliptical, polygonal, rhombic, or track-shaped.

In an embodiment, the color pattern may include a lower color pattern and an upper color pattern disposed on the lower color pattern, one of the lower color pattern and the upper color pattern may include the same material as the third color filter, and the other of the lower color pattern and the upper color pattern may include the same material as the second color filter.

In an embodiment, the display device may further include a light blocking pattern disposed in the third opening and covered by the third color filter.

In an embodiment, the light blocking pattern may include a same material as the light blocking member.

In an embodiment, the light blocking pattern may include at least one selected from the same material as the first color filter and the same material as the second color filter.

In an embodiment, the light blocking pattern may include a lower light blocking pattern and an upper light blocking pattern disposed on the lower light blocking pattern, one of the lower light blocking pattern and the upper light blocking pattern may include the same material as the first color filter, and the other of the lower light blocking pattern and the upper light blocking pattern may include the same material as the second color filter.

In an embodiment, the display device may further include a first touch electrode disposed on the encapsulation layer, a touch insulating layer covering the first touch electrode, where a trench may be defined on the touch insulating layer to overlap the color pattern, a second touch electrode disposed on the touch insulating layer and overlapping the first touch electrode, and a reflective pattern disposed in the trench of the touch insulating layer and overlapping the color pattern, where the reflective pattern may include a same material as the second touch electrode.

The display device according to embodiments may include the light blocking member and the color filter layer in a way, such that a separate polarizing plate may not be disposed. Accordingly, a weight and/or a thickness of the display device may be reduced, and a visibility of the display device may be improved.

In such embodiments, the display device may include the first color pattern covered by the first color filter and the second color pattern covered by the second color filter. In such embodiments, each of the first color pattern and the second color pattern may include the same material as the third color filter. Accordingly, the portion where the first color pattern and the first color filter overlap and the portion where the second color pattern and the second color filter overlap may absorb external light. Accordingly, a reflectance of the external light of the display device may be reduced and a reflective color may be improved, such that a display quality of the display device may be improved.

In such embodiments, the display device may include the reflective pattern disposed in the trench of the touch insulating layer and overlapping the first color pattern and the second color pattern. Accordingly, some of the light emitted from the light emitting devices may be reflected by the reflective pattern and some of the light reflected from the reflective pattern may be reflected again by structures (e.g., a common electrode, etc.), and emitted to the outside. Accordingly, a recycling efficiency of the light emitted from the light emitting devices may be improved, such that a display quality of the display device may be improved.

BRIEF DESCRIPTION OF THE DRAWINGS

Illustrative, non-limiting embodiments will be more clearly understood from the following detailed description taken in conjunction with the accompanying drawings.

FIG. 2 is an enlarged view illustrating an area 'A' of FIG. 1.

DETAILED DESCRIPTION

Figure 1:
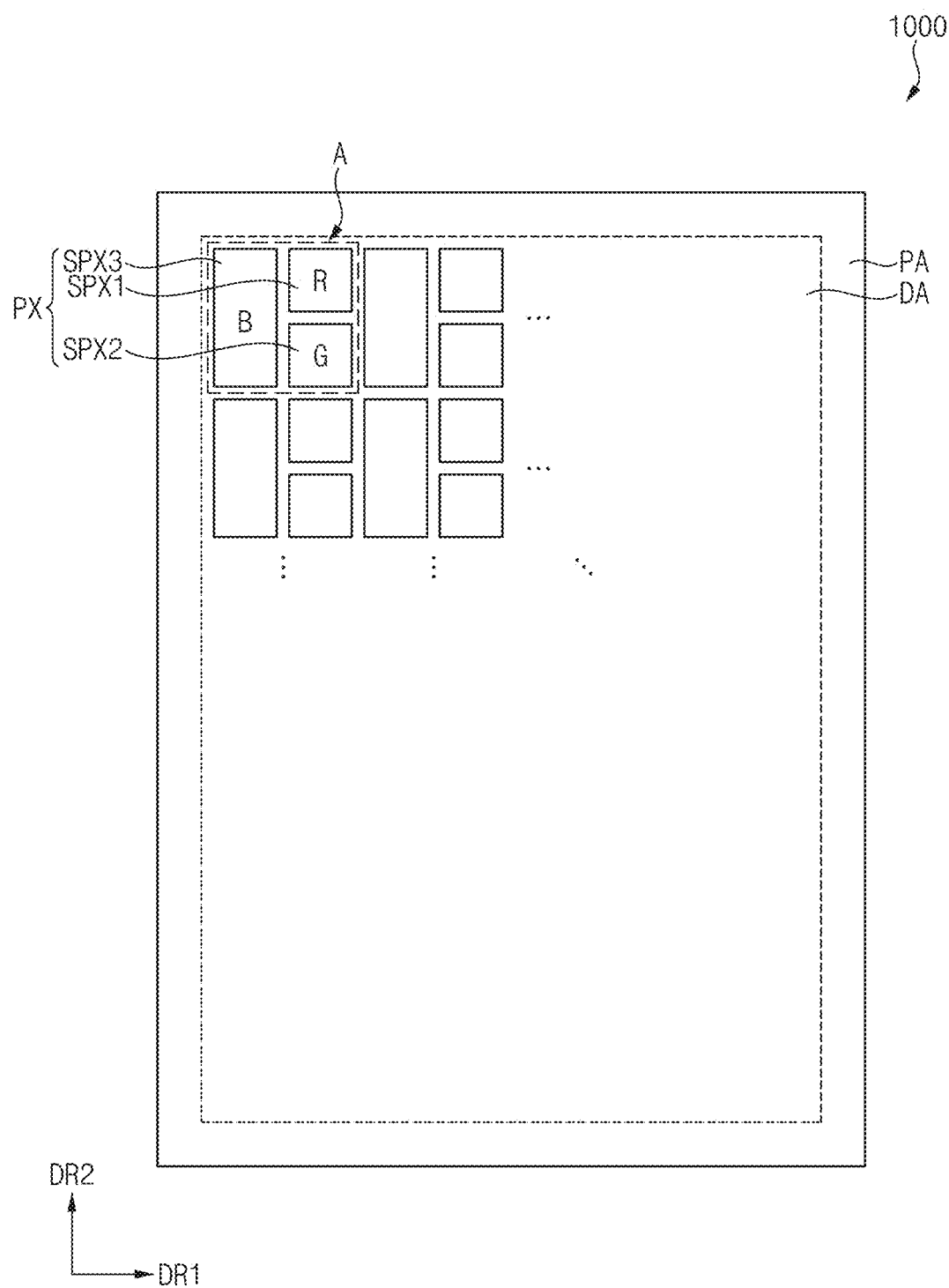
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a plan view illustrating a display device according to an embodiment.

Referring to FIG. 1, a display device 1000 according to an embodiment may include a display area DA and a peripheral area PA. The display area DA may mean an area in which an image is played. The peripheral area PA may mean an area in which no image is displayed. The peripheral area PA may be located around the display area DA. In an embodiment, for example, the peripheral area PA may surround the display area DA.

The display device 1000 may include a plurality of pixels PX disposed in the display area DA. In a plan view, the pixels PX may be repeatedly arranged along a first direction DR1 and a second direction DR2. The second direction DR2 may be orthogonal to the first direction DR1.

Each of the pixels PX may include a plurality of sub-pixels that emits light of different colors from each other. In an embodiment, each of the pixels PX may include first to third sub-pixels SPX1, SPX2, and SPX3 that emit light of different colors, respectively. In an embodiment, for example, the first sub-pixel SPX1 may emit a red light, the second sub-pixel SPX2 may emit a green light, and the third sub-pixel SPX3 may emit a blue light. However, the invention is not necessarily limited thereto. In an alternative embodiment, for example, the first to third sub-pixels SPX1, SPX2, and SPX3 may be combined so that each of the pixels PX emits yellow, cyan, and magenta lights.

In an embodiment, the arrangement structure of the first to third sub-pixels SPX1, SPX2, and SPX3 may be an S-stripe structure. In an embodiment, for example, the third sub-pixel SPX3 may be disposed in a first column, and the first sub-pixel SPX1 and the second sub-pixel SPX2 may be disposed in a second column adjacent to the first column. In such an embodiment, the third sub-pixel SPX3 may have a rectangular planar shape with a long side in the second direction DR2, and the first sub-pixel SPX1 and the second sub-pixel SPX2 may have a rectangular planar shape. In such an embodiment, one side of each of the first sub-pixel SPX1 and the second sub-pixel SPX2 may be disposed to face the long side of the third sub-pixel SPX3. However, the invention is not necessarily limited thereto, and in an alternative embodiment, the arrangement structure of the first to third sub-pixels SPX1, SPX2, and SPX3 may have a pentile structure.

Figure 3:
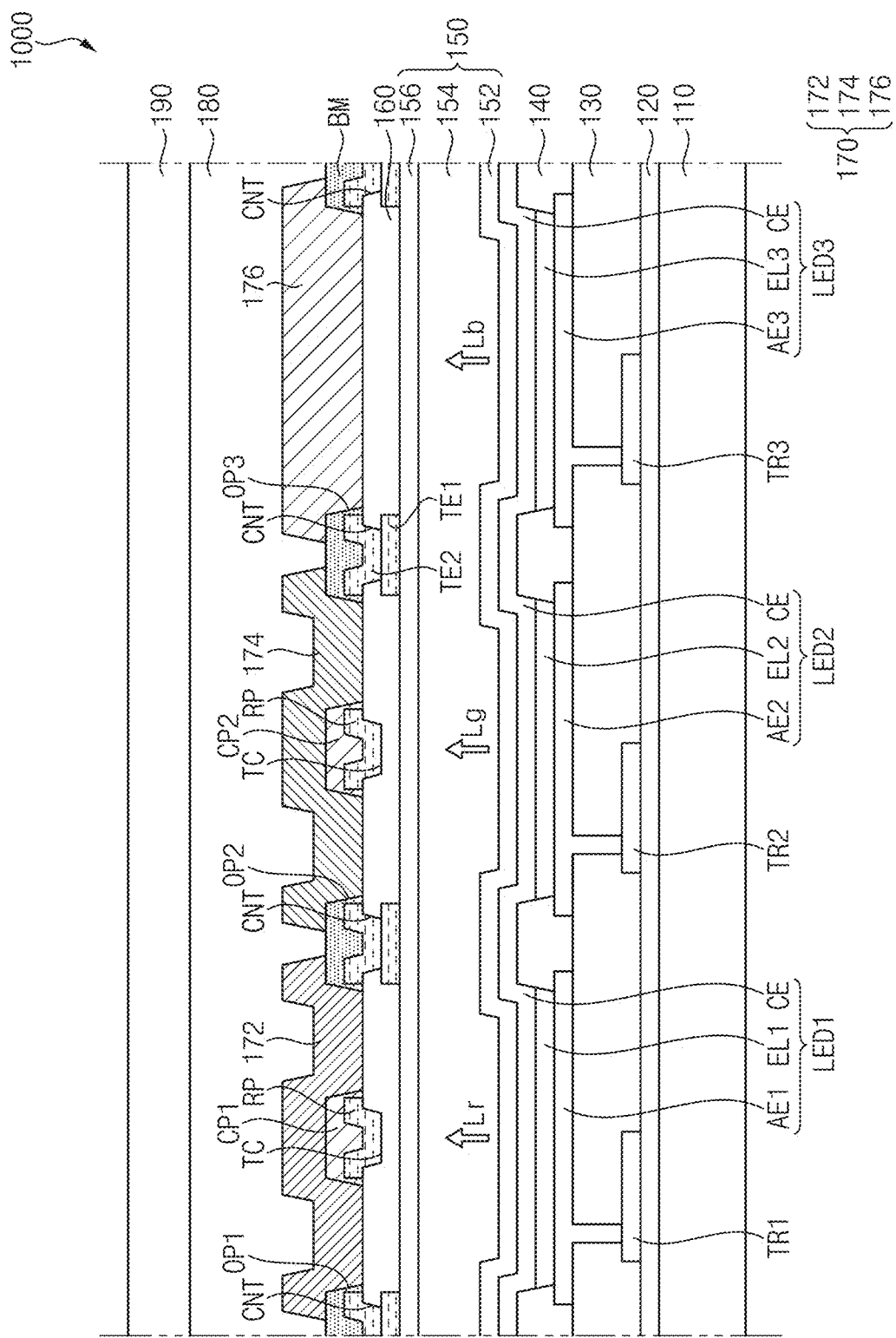
FIG. 3 is a cross-sectional view illustrating an embodiment of the display device of FIG. 1.

FIG. 2 is an enlarged view illustrating an area 'A' of FIG. 1, and FIG. 3 is a cross-sectional view illustrating an embodiment of the display device of FIG. 1. Specifically, FIG. 3 is a cross-sectional view illustrating an embodiment of the area 'A' of FIG. 1.

Referring to FIGS. 2 and 3, the display device 1000 according to an embodiment may include a substrate 110, a buffer layer 120, first to third driving devices TR1, TR2, and TR3, an insulating structure 130, a pixel defining layer 140, first to third light emitting devices LED1, LED2, and LED3, an encapsulation layer 150, a first touch electrode TE1, a touch insulating layer 160, a second touch electrode TE2, a reflective pattern RP, a light blocking member BM, a first color pattern CP1, a second color pattern CP2, a color filter layer 170, an overcoat layer 180, and a window 190. The color filter layer 170 may include a first color filter 172, a second color filter 174, and a third color filter 176

The substrate 110 may include a transparent material or an opaque material. In an embodiment, the substrate 110 may include a first organic layer, a first barrier layer, a second organic layer, a second barrier layer, or the like. In an embodiment, the substrate 110 may be a quartz substrate, a synthetic quartz substrate, a calcium fluoride substrate, an F-doped quartz substrate, a sodalime glass substrate, a non-alkali glass substrate, or the like. These may be used alone or in combination with each other.

The buffer layer 120 may be disposed on the substrate 110. The buffer layer 120 may prevent diffusion of impurities such as oxygen, moisture, or the like to an upper portion of the substrate 110 through the substrate 110. The buffer layer 120 may include an inorganic insulating material such as a silicon compound or a metal oxide. The buffer layer 120 may have a single-layer structure or a multi-layer structure including a plurality of insulating layers. In an alternative embodiment, the buffer layer 120 may be omitted.

The first to third driving devices TR1, TR2, and TR3 may be disposed on the buffer layer 120. In an embodiment, each of the first to third driving device TR1, TR2, and TR3 may include at least one thin film transistor. The channel layer of the thin film transistor may include an oxide semiconductor, a silicon semiconductor, or an organic semiconductor. In an embodiment, for example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include amorphous silicon, polycrystalline silicon, or the like.

The insulating structure 130 may cover the first to third driving devices TR1, TR2, and TR3. The insulating structure 130 may include a combination of an inorganic insulating layer and an organic insulating layer. In an embodiment, for example, the inorganic insulating layer may include silicon oxide (SiOx), silicon nitride (SiNx), silicon carbide (SiCx), silicon oxynitride (SiOxNy), silicon oxycarbide (SiOxCy), or the like. In addition, the organic insulating layer may include photoresist, polyacryl-based resin, polyimide-based resin, polyamide-based resin, siloxane-based resin, acrylic-based resin, epoxy-based resin, or the like. These may be used alone or in combination with each other.

First to third pixel electrodes AE1, AE2, and AE3 may be disposed on the insulating structure 130. Each of the first to third pixel electrodes AE1, AE2, and AE3 may include a conductive material such as metal, alloy, conductive metal nitride, conductive metal oxide, or transparent conductive material. Each of the first to third pixel electrodes AE1, AE2, and AE3 may have a single-layer structure or a multi-layer structure including a plurality of conductive layers.

The first to third pixel electrodes AE1, AE2, and AE3 may be electrically connected to the first to third driving devices TR1, TR2, and TR3 through contact holes defined or formed in the insulating structure 130, respectively.

The pixel defining layer 140 may be disposed on the first to third pixel electrodes AE1, AE2, and AE3. The pixel defining layer 140 may include an organic insulating material. In an embodiment, the organic insulating material of the pixel defining layer 140 include photoresist, polyacryl-based resin, polyimide-based resin, polyamide-based resin, siloxane-based resin, acrylic-based resin, epoxy-based resin, or the like. These may be used alone or in combination with each other. The pixel defining layer 140 may define a pixel opening exposing at least a portion of each of the first to third pixel electrodes AE1, AE2, and AE3. An emission area and a non-emission area of the display device 1000 may be defined by the pixel opening. In an embodiment for example, a portion where the pixel opening is defined may correspond to the emission area, and a portion where the pixel defining layer 140 is disposed may correspond to the non-emission area.

First to third emission layers EL1, EL2, and EL3 may be disposed on the first to third pixel electrodes AE1, AE2, and AE3 exposed by the pixel opening of the pixel defining layer 140. In an embodiment, for example, the first emission layer EL1 may be disposed on the first pixel electrode AE1, the second emission layer EL2 may be disposed on the second pixel electrode AE2, and the third pixel electrode AE3 may be disposed on the third emission layer EL3.

In an embodiment, the first emission layer EL1 may include a light emitting material that emits a red light Lr, the second emission layer EL2 may include a light emitting material that emits a green light Lg, and the third emission layer EL3 may include a light emitting material that emits a blue light Lb. However, the invention is not necessarily limited thereto.

In an embodiment, functional layers such as a hole injection layer, a hole transport layer, an electron transport layer, and an electron injection layer may be disposed above and/or below each of the first to third emission layers EL1, EL2, and EL3.

A common electrode CE may be disposed on the first to third emission layers EL1, EL2, and EL3. The common electrode CE may include a conductive material such as a metal, an alloy, a conductive metal nitride, a conductive metal oxide, or a transparent conductive material. The common electrode CE may have a single-layer structure or a multi-layer structure including a plurality of conductive layers. In an embodiment, the common electrode CE may continuously extend or commonly provided over a plurality of pixels.

The first pixel electrode AE1, the first emission layer EL1, and the common electrode CE may constitute (or collectively define) the first light emitting device LED1, the second pixel electrode AE2, the second emission layer EL2, and the common electrode CE may constitute the second light emitting device LED2, and the third pixel electrode AE3, the third emission layer EL3, and the common electrode CE may constitute the third light emitting device LED3. In an embodiment, the first light emitting device LED1, the second light emitting device LED2, and the third light emitting device LED3 may be spaced apart from each other.

In an embodiment, the first light emitting device LED1 may emit the red light Lr, the second light emitting device LED2 may emit the green light Lg, and the third light emitting device LED3 may emit the blue light Lb. However, the invention is not necessarily limited thereto.

In embodiments, the light emitting devices included in the display device 1000 may not be limited to the first to third light emitting devices LED1, LED2, and LED3. In embodiments, the light emitting device may be a light emitting device including at least one selected from a micro-LED, a nano-LED, a quantum dot (QD), and a quantum rod (QR), for example.

The encapsulation layer 150 may be disposed on the common electrode CE. The encapsulation layer 150 may include at least one inorganic encapsulation layer and at least one organic encapsulation layer. In an embodiment, the encapsulation layer 150 may include a first inorganic encapsulation layer 152 disposed on the common electrode CE, an organic encapsulation layer 154 disposed on the first inorganic encapsulation layer 152, and a second inorganic encapsulation layer 156 disposed on the organic encapsulation layer 154. The first touch electrode TE1 may be disposed on the encapsulation layer 150.

In an embodiment, the first touch electrode TE1 may be disposed in the non-emission area. In such an embodiment, the first touch electrode TE1 may overlap the pixel defining layer 140. The first touch electrode TE1 may include a metal, an alloy, a conductive metal oxide, a transparent conductive material, or the like. In an embodiment, for example, materials of the first touch electrode TE1 may include silver (Ag), an alloy containing silver, molybdenum (Mo), an alloy containing molybdenum, aluminum (Al), and aluminum. alloy, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

In an alternative embodiment, a separate insulating layer may be additionally disposed between the encapsulation layer 150 and the first touch electrode TE1.

The touch insulating layer 160 may cover the first touch electrode TEL The touch insulating layer 160 may include an inorganic insulating material. In an embodiment, for example, materials of the touch insulating layer 160 may include a silicon oxide, a silicon nitride, or a silicon oxynitride. These may be used alone or in combination with each other. A contact hole CNT exposing a portion of the first touch electrode TE1 may be defined in the touch insulating layer 160.

In an embodiment, a trench TC may be defined in the touch insulating layer 160. The trench TC may be defined through the upper surface of the touch insulating layer 160. In an embodiment, the trench TC may be formed together with the contact hole CNT exposing the portion of the first touch electrode TE1. In an embodiment, the trench TC may be defined to overlap the first light emitting device LED1 and the second light emitting device LED2. In FIG. 3, the cross-sectional shape of the trench TC is shown as a reverse tapered shape, but the invention is not necessarily limited thereto. The trench TC may provide a space in which the reflective pattern RP is disposed on the touch insulating layer 160.

The second touch electrode TE2 may be disposed on the touch insulating layer 160 and overlap the first touch electrode TEL In such an embodiment, the second touch electrode TE2 may be disposed in the non-emission area of the display device 1000. The second touch electrode TE2 may electrically contact the first touch electrode TE1 through the contact hole CNT exposing the portion of the first touch electrode TEL The second touch electrode TE2 may include a metal, an alloy, a conductive metal oxide, a transparent conductive material, or the like. In an embodiment, for example, materials of the second touch electrode TE2 may include silver (Ag), an alloy containing silver, molybdenum (Mo), an alloy containing molybdenum, aluminum (Al), and aluminum. alloy, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

In an embodiment, the second touch electrode TE2 may have a multi-layer structure in which a plurality of metal layers are stacked. In an embodiment, for example, the second touch electrode TE2 may have a two-layer structure of titanium (Ti)/aluminum (Al), a two-layer structure of aluminum (Al)/molybdenum (Mo), or a two-layer structure of titanium (Ti)/copper (Cu), or the like.

The first touch electrode TE1 and the second touch electrode TE2 may constitute a touch electrode. In an embodiment, the touch electrode may have a mesh structure on a plane or in a plan view. However, the invention is not necessarily limited thereto, and the structure of the touch electrode may be variously modified.

The reflective pattern RP may be disposed in the trench TC of the touch insulating layer 160. In an embodiment, the reflective pattern RP may overlap the first light emitting device LED1 and the second light emitting element LED2. The reflective pattern RP may reflect light emitted from the light emitting devices. In such an embodiment, the light reflected by the reflective pattern RP may be reflected again from structures (e.g., the common electrode CE) below the reflective pattern RP and emitted to the outside. Accordingly, a recycling efficiency of the light emitted from the light emitting devices may be improved. In an embodiment, the reflective pattern RP may be formed together with the second touch electrode TE2. In such an embodiment, the reflective pattern RP may include a same material as the second touch electrode TE2. In an embodiment, for example, materials of the reflection pattern RP may include silver (Ag), an alloy containing silver, molybdenum (Mo), an alloy containing molybdenum, aluminum (Al), an alloy containing aluminum, Aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

In an embodiment, the reflective pattern RP may have a multi-layer structure in which a plurality of metal layers are stacked. In an embodiment, for example, the reflective pattern RP may have a two-layer structure of titanium (Ti)/aluminum (Al), a two-layer structure of aluminum (Al)/molybdenum (Mo), or a two-layer structure of titanium (Ti)/copper (Cu), or the like.

The light blocking member BM may be disposed on the touch insulating layer 160. In an embodiment, the light blocking member BM may entirely overlap the non-emission area and have a grid shape on a plane or in a plan view. In such an embodiment, the light blocking member BM may overlap the pixel defining layer 140 and the touch electrode. In an embodiment, the light blocking member BM may cover the second touch electrode TE2.

In an embodiment, the light blocking member BM may absorb an external light. Accordingly, the light blocking member BM may reduce an external light reflectance of the display device 1000. In an embodiment, for example, materials of the light blocking member BM may include chromium (Cr), chromium oxide (CrOx), chromium nitride (CrNx), carbon black, a black pigment mixture, a black dye mixture, or the like. These may be used alone or in combination with each other.

In an embodiment, the light blocking member BM may define a plurality of openings exposing a portion of the touch insulating layer 160. In an embodiment, for example, the light blocking member BM may define a first opening OP1 corresponding to the first light emitting device LED1, a second opening OP2 corresponding to the second light emitting device LED2, and a third opening OP3 corresponding to the third light emitting device LED3. In such an embodiment, the first opening OP1 may overlap the first light emitting device LED1, the second opening OP2 may overlap the second light emitting device LED2, and the third opening OP3 may overlap the third light emitting device LED3. In such an embodiment, the first opening OP1 and the second opening OP2 may also expose the reflective pattern RP.

The first color pattern CP1 may be disposed on the touch insulating layer 160. In an embodiment, the first color pattern CP1 may be disposed in the first opening OP1 defined by the light blocking member BM and cover the reflective pattern RP exposed by the first opening OP1. In such an embodiment, the first color pattern CP1 may overlap the reflective pattern RP exposed by the first opening OP1 and the first light emitting device LED1.

The second color pattern CP2 may be disposed on the touch insulating layer 160. In an embodiment, the second color pattern CP2 may be disposed in the second opening OP2 defined by the light blocking member BM and cover the reflective pattern RP exposed by the second opening OP2. In such an embodiment, the second color pattern CP2 may overlap the reflective pattern RP exposed by the second opening OP2 and the second light emitting device LED2.

In an embodiment, as shown in FIG. 2, a planar shape of each of the first color pattern CP1 and the second color pattern CP2 may be circular. However, the invention is not necessarily limited thereto, and in an alternative embodiment, the planar shape of each of the first color pattern CP1 and the second color pattern CP2 may be elliptical, polygonal, rhombic, or track-shaped.

In an embodiment, as shown in FIG. 3, the cross-sectional shapes of each of the first color pattern CP1 and the second color pattern CP2 may be a tapered shape, but the invention is not necessarily limited thereto, and in an alternative embodiment, the cross-sectional shapes of each of the first color pattern CP1 and the second color pattern CP2 may be rectangular.

In an alternative embodiment, a touch protection layer (not shown) may be additionally disposed between the touch insulating layer 160 and the light blocking member BM. In such an embodiment, the second touch electrode TE2 and the reflective pattern RP may be covered by the touch protection layer, the light blocking member BM may be disposed on the touch protection layer to overlap the touch electrode, and the first color pattern CP1 and the second color pattern CP2 may be disposed on the touch protection layer to overlap the reflective pattern RP. In an embodiment, for example, of the touch protection layer may include a silicon oxide, a silicon nitride, a silicon oxynitride, or the like. These may be used alone or in combination with each other.

The color filter layer 170 may be disposed on the touch insulating layer 160 on which the light blocking member BM, the first color pattern CP1 and the second color pattern CP2 are disposed. In an embodiment where the touch protection layer is additionally disposed, the color filter layer 170 may be disposed on the touch protection layer on which the light blocking member BM, the first color pattern CP1 and the second color pattern CP2 are disposed.

The color filter layer 170 may be disposed in the first to third openings OP1, OP2, and OP3 defined by the light blocking member BM. In an embodiment, the color filter layer 170 may partially overlap the light blocking member BM. A color of the light emitted from the first to third light emitting devices LED1, LED2, and LED3 may be viewed more distinctly as it passes through the color filter layer 170.

In an embodiment, the color filter layer 170 may include the first color filter 172, the second color filter 174, and the third color filter 176. In an embodiment, the first color filter 172, the second color filter 174, and the third color filter 176 may be spaced apart from each other. However, the invention is not necessarily limited thereto, and in an alternative embodiment, each of the first color filter 172, the second color filter 174, and the third color filter 176 may partially overlaps each other on the light blocking member BM.

In an embodiment, each of the first color filter 172, the second color filter 174, and the third color filter 176 may transmit a light of a specific color and block a light of a color other than the specific color. In an embodiment, for example, each of the first color filter 172, the second color filter 174, and the third color filter 176 may include a dye and/or a pigment that absorbs a light of a color other than the specific color.

In an embodiment, the first color filter 172 may be disposed in the first opening OP1, the second color filter 174 may be disposed in the second opening OP2, and the third color filter 176 may be disposed in the third opening OP3. In such an embodiment, the first color filter 172 may correspond to the first light emitting device LED1, the second color filter 174 may correspond to the second light emitting device LED2, and the third color filter 176 may correspond to the third light emitting device LED3.

In such an embodiment, a light emitted from the first light emitting device LED1 and passing through the first color filter 172 may correspond to a light emitted from the first sub-pixel SPX1 of FIG. 2. In such an embodiment, a light emitted from the second light emitting device LED2 and passing through the second color filter 174 may correspond to a light emitted from the second sub-pixel SPX2 of FIG. 2. In such an embodiment, a light emitted from the third light emitting device LED3 and passing through the third color filter 176 may correspond to a light emitted from the third sub-pixel SPX3 of FIG. 2.

In an embodiment, the first color filter 172 may cover the first color pattern CP1 disposed in the first opening OP1 and the second color filter 174 may cover the second color pattern CP2 disposed in the second opening OP2. Accordingly, the first color pattern CP1 may overlap a portion of the first color filter 172 and the second color pattern CP2 may overlap a portion of the second color filter 174. The portion where the first color pattern CP1 and the first color filter 172 overlap and the portion where the second color pattern CP2 and the second color filter 174 overlap may absorb an external light. Accordingly, a reflectance of the external light in each of the first and second openings OP1 and OP2 may be reduced.

In an embodiment, the first color pattern CP1, the second color pattern CP2, and the third color filter 176 may include a same material as each other. In an embodiment, for example, each of the first color pattern CP1 and the second color pattern CP2 may include a dye and/or a pigment included in the third color filter 176. Accordingly, reflective colors in each of the first and second openings OP1 and OP2 may be improved.

In an embodiment, a color of a light selectively transmitted by each of the first to third color filters 172, 174, and 176 may be determined based on a color of light emitted from the first to third light emitting devices LED1, LED2, and LED3. In an embodiment, for example, as shown in FIG. 3, the first light emitting device LED1 may emit a red light Lr, the second light emitting device LED2 may emit a green light Lg, the third light emitting device LED3 may emit a blue light Lb, the first color filter 172 may be a red color filter that selectively transmits the red light Lr, the second color filter 174 may be a green color filter that selectively transmit the green light Lg, and the third color filter 176 may be a blue color filter that selectively transmits the blue light Lb.

In such an embodiment, the first color filter 172 may include a dye and/or a pigment that absorb light of colors other than red, the second color filter 174 may include a dye and/or a pigment that absorb light of colors other than green, and the third color filter 176 may include a dye and/or a pigment that absorbs light of colors other than blue. In such an embodiment, each of the first color pattern CP1 and the second color pattern CP2 may include a dye and/or a pigment that absorbs light of colors other than blue. However, the invention is not necessarily limited thereto.

The overcoat layer 180 may be disposed on the light blocking member BM and the color filter layer 170. The overcoat layer 180 may cover the light blocking member BM and the color filter layer 170. Accordingly, a reliability of the light blocking member BM and the color filter layer 170 may be improved. In an embodiment, the overcoat layer 180 may have a substantially flat upper surface. Accordingly, the overcoat layer 180 may compensate for a step difference on a lower surface. In an embodiment, the overcoat layer 180 may include an organic material. In an embodiment, for example, the organic materials of the overcoat layer 180 may include photoresist, polyacrylic resin, polyimide resin, acrylic resin, epoxy resin, acrylate resin, or the like. These may be used alone or in combination with each other.

The window 190 may be disposed on the overcoat layer 180. In an embodiment, for example, materials of the window 190 may include glass, quartz, plastic, or the like. These may be used alone or in combination with each other. The window 190 may protect the above-described components from external force.

According to embodiments, the display device 1000 may include the light blocking member BM and the color filter layer 170, so that a separate polarizing plate may not be disposed. Accordingly, a weight and/or a thickness of the display device 1000 may be reduced. Also, a visibility of the display device 1000 may be improved.

In such embodiments, the display device 1000 may include the first color pattern CP1 covered by the first color filter 172 and the second color pattern CP2 covered by the second color filter 174. In such embodiments, each of the first color pattern CP1 and the second color pattern CP2 may include a same material as the third color filter 176. Accordingly, the portion where the first color pattern CP1 and the first color filter 172 overlap and the portion where the second color pattern CP2 and the second color filter 174 overlap may absorb external light. Accordingly, a reflectance of the external light of the display device 1000 may be reduced and a reflective color may be improved, such that a display quality of the display device 1000 may be improved.

In such embodiments, the display device 1000 may include the reflective pattern RP disposed in the trench TC of the touch insulating layer 160 and overlapping the first color pattern CP1 and the second color pattern CP2. Accordingly, some of the light emitted from the light emitting devices may be reflected by the reflective pattern RP and some of the light reflected from the reflective pattern RP may be reflected again by structures (e.g., a common electrode CE, etc.), and emitted to the outside. Accordingly, a recycling efficiency of the light emitted from the light emitting devices may be improved, such that a display quality of the display device 1000 may be improved.

FIGS. 4 to 10 are cross-sectional views illustrating a manufacturing method of the display device of FIG. 1. Hereinafter, a manufacturing method of the display device 1000 according to an embodiment will be described with reference to FIGS. 4 to 10.

Figure 4:
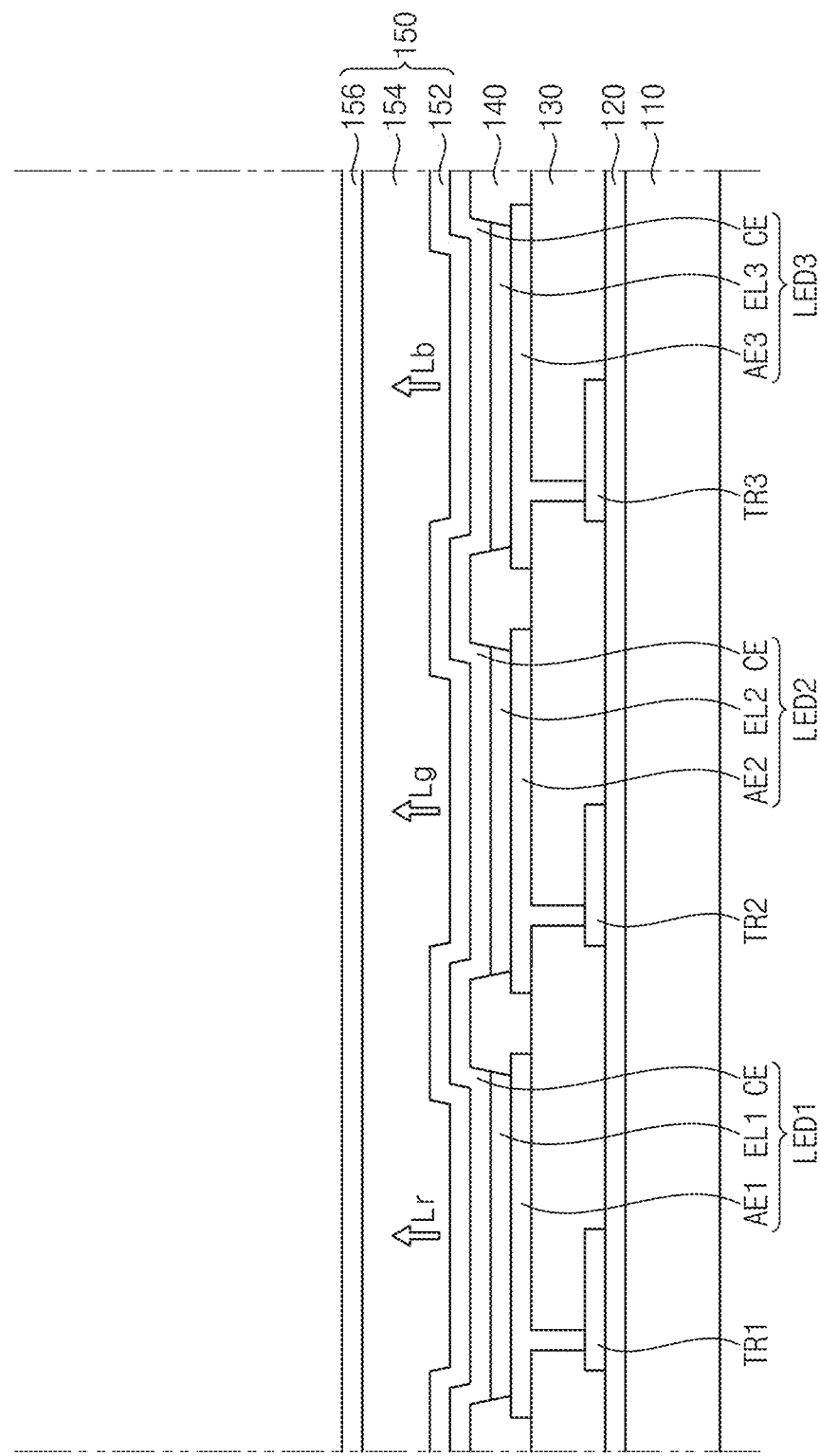
FIGS. 4 to 10 are cross-sectional views illustrating a manufacturing method of the display device of FIG. 1.

Referring to FIG. 4, the buffer layer 120 may be formed (or provided) on the substrate 110. Subsequently, the first to third driving devices TR1, TR2, and TR3 may be formed on the buffer layer 120. Subsequently, the insulating structure 130 may be formed on the buffer layer 120 on which the first to third driving devices TR1, TR2, and TR3 are disposed. The insulating structure 130 may cover the first to third driving devices TR1, TR2, and TR3. Subsequently, the first to third pixel electrodes AE1, AE2, and AE3 may be formed on the insulating structure 130. Thereafter, the pixel defining layer 140 defining the pixel opening exposing portions of the first to third pixel electrodes AE1, AE2, and AE3 may be formed on the insulating structure 130 and the first to third pixel electrodes AE1, AE2, and AE3.

Thereafter, the first to third emission layers EL1, EL2, and EL3 may be formed on the first to third pixel electrodes AE1, AE2, and AE3 exposed by the pixel opening. In an embodiment, for example, the first emission layer EL1 may be formed on the first pixel electrode AE1, the second emission layer EL2 may be formed on the second pixel electrode AE2, and the third emission layer EL3 may be formed on third pixel electrode AE3. Then, the common electrode CE may be formed on the first to third emission layers EL1, EL2, and EL3 and the pixel defining layer 140.

Accordingly, the first light emitting device LED1 including the first pixel electrode AE1, the first emission layer EL1, and the common electrode CE may be formed, the second light emitting device LED2 including the second pixel electrode AE2, the second emission layer EL2, and the common electrode CE may be formed, and the third light emitting device LED3 including the third pixel electrode AE3, the third emission layer EL3, and the common electrode CE may be formed. In an embodiment, the first light emitting device LED1, the second light emitting device LED2, and the third light emitting device LED3 may be spaced apart from each other. In an embodiment, the first light emitting device LED1 may emit a red light Lr, the second light emitting device LED2 may emit a green light Lg, and the third light emitting device LED3 may emit a blue light Lb. However, the invention is not necessarily limited thereto.

Thereafter, the encapsulation layer 150 may be formed on the common electrode CE. The encapsulation layer 150 may be formed by sequentially forming the first inorganic encapsulation layer 152, the organic encapsulation layer 154, and the second inorganic encapsulation layer 156 on the common electrode CE.

Figure 5:
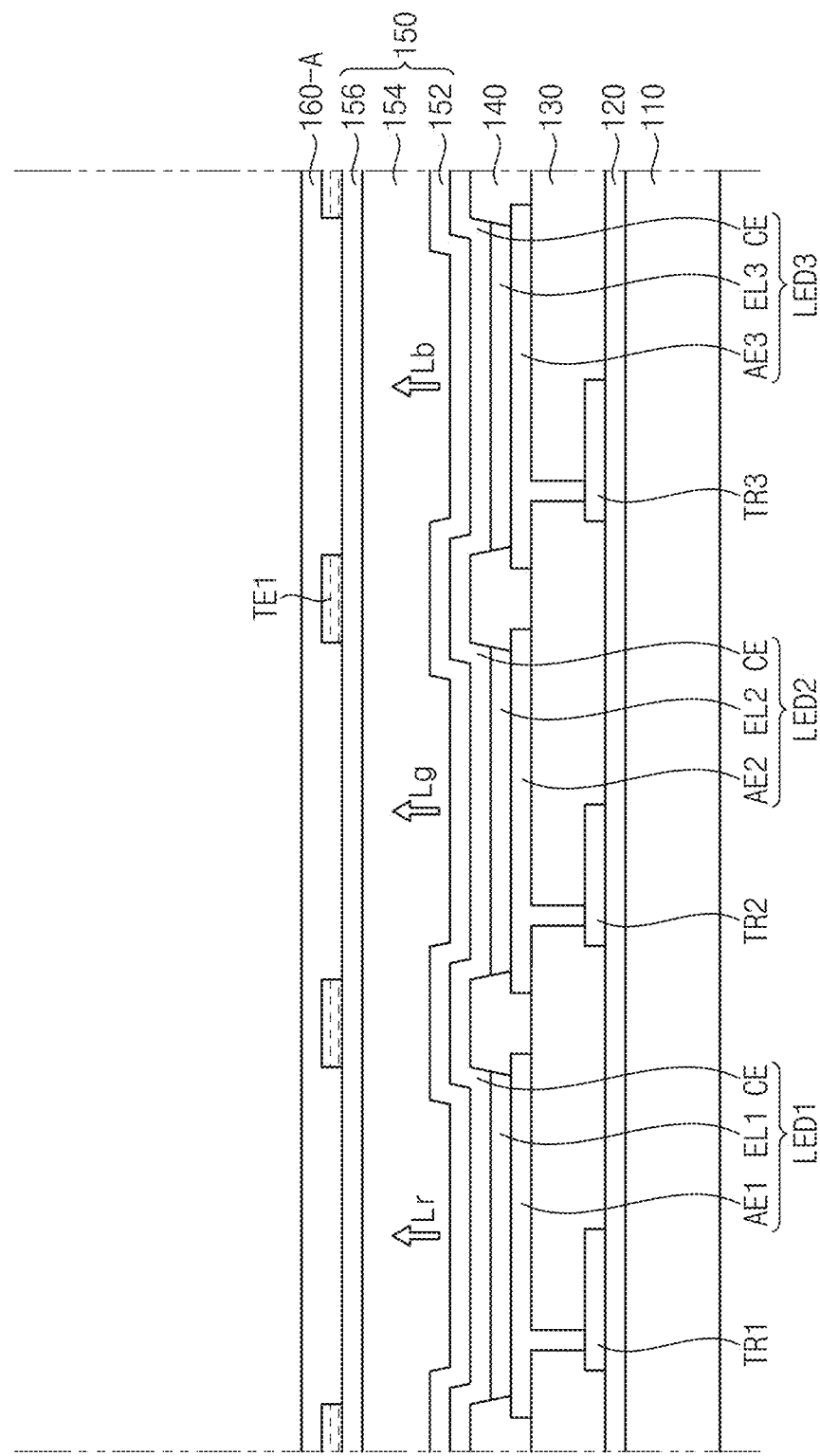

Referring to FIG. 5, the first touch electrode TE1 may be formed on the encapsulation layer 150. The first touch electrode TE1 may overlap the pixel defining layer 140. Thereafter, a preliminary touch insulating layer 160-A may be formed on the first touch electrode TE1. The preliminary touch insulating layer 160-A may cover the first touch electrode TE1.

Figure 6:
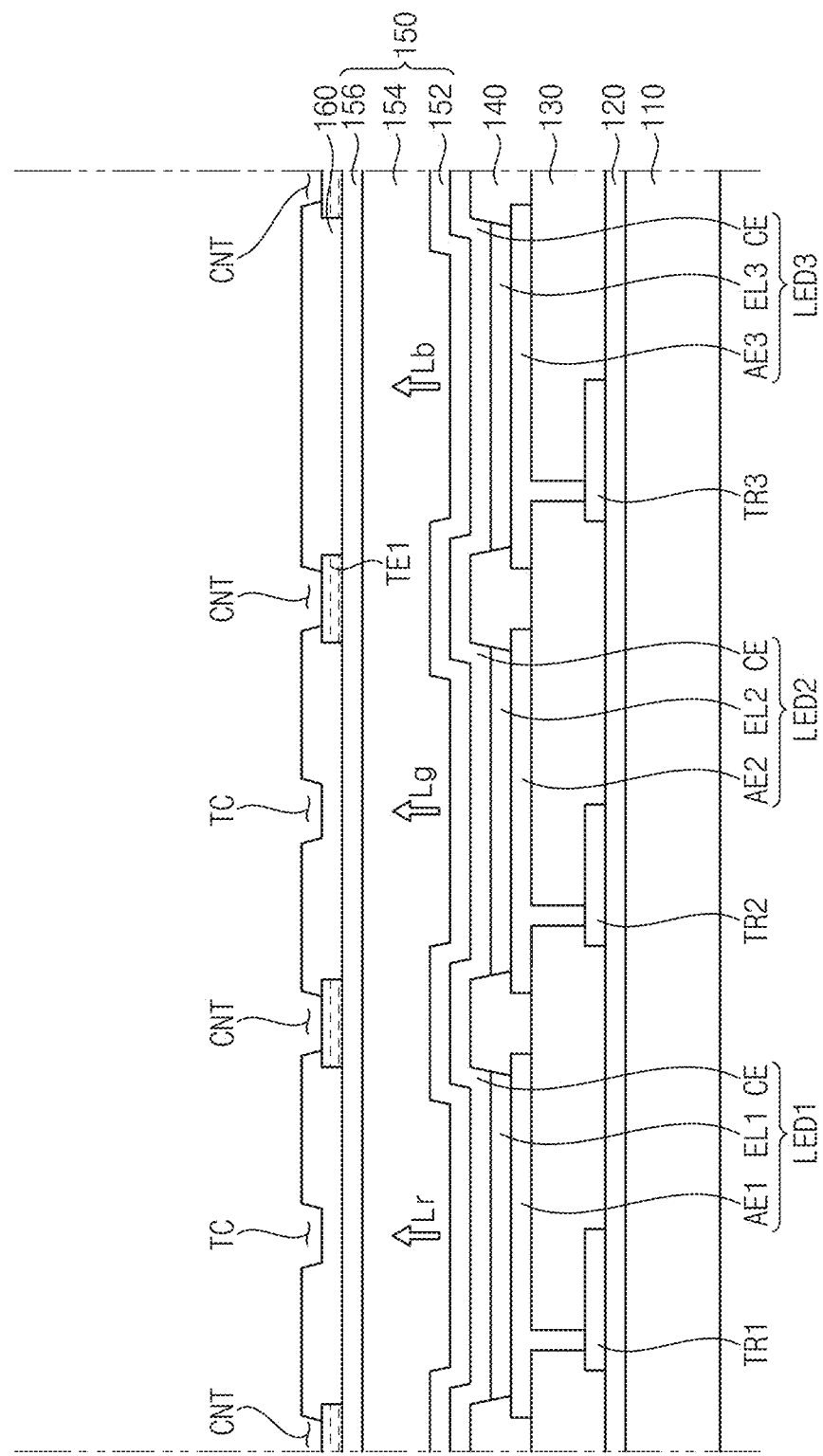

Referring to FIG. 6, a portion of the preliminary touch insulating layer 160-A may be removed to form the touch insulating layer 160 in which the contact hole CNT and the trench TC are defined. In an embodiment, the contact hole CNT and the trench TC may be formed together or in a same process. In an embodiment, for example, the contact hole CNT and the trench TC may be formed in the same process by forming a photoresist film exposing a portion of the preliminary touch insulating layer 160-A on the preliminary touch insulating layer 160-A and etching the preliminary touch insulating layer 160-A exposed from the photoresist film. However, the invention is not necessarily limited thereto. In an alternative embodiment, for example, each of the contact hole CNT and the trench TC may be formed in a separate process. The contact hole CNT may overlap the pixel defining layer 140 and expose a portion of the first touch electrode TE1. The trench TC may overlap each of the first light emitting device LED1 and the second light emitting device LED2.

Figure 7:
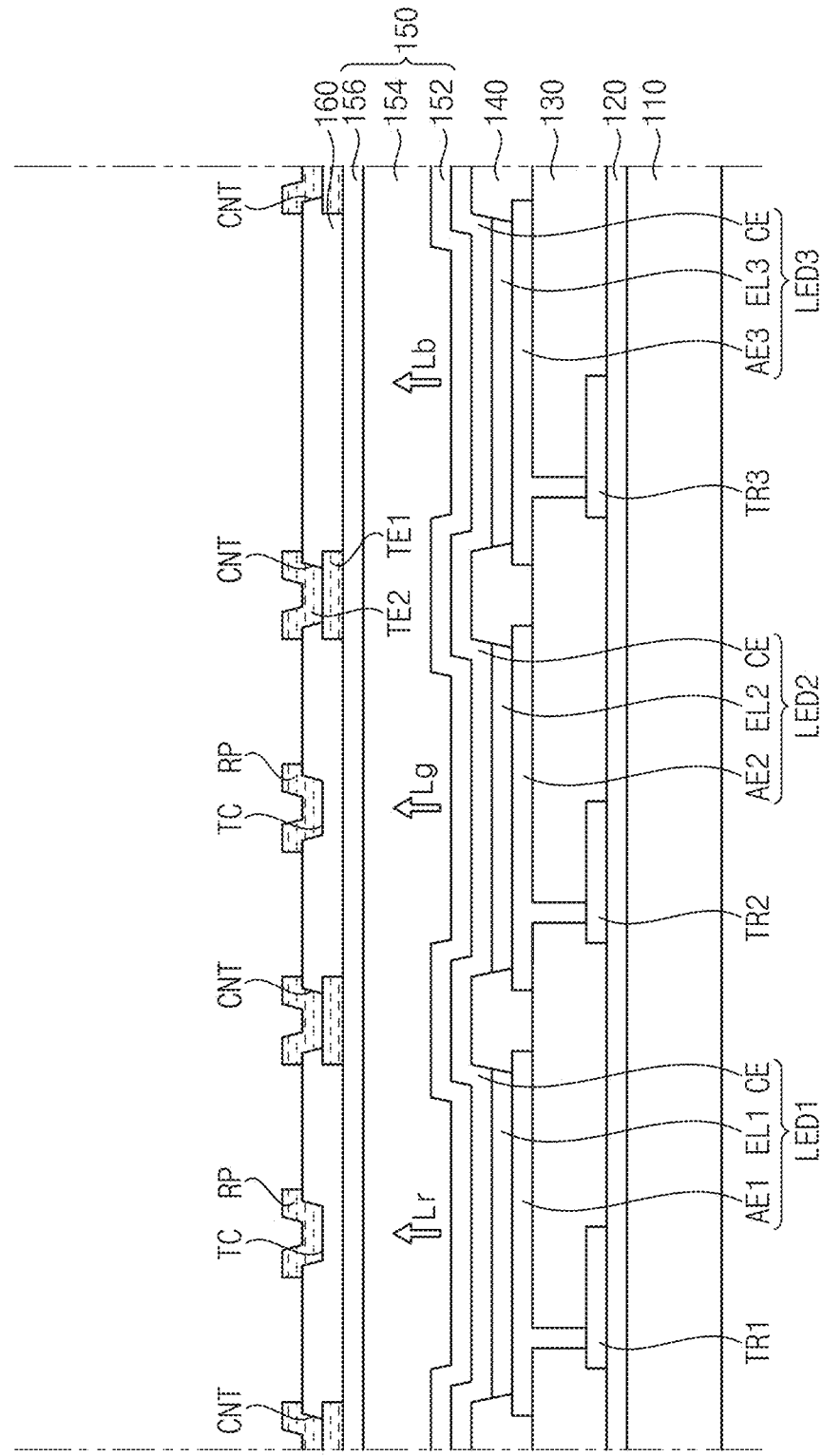

Referring to FIG. 7, the second touch electrode TE2 and the reflective pattern RP may be formed on the touch insulating layer 160.

The second touch electrode TE2 may be disposed to overlap the first touch electrode TEL The second touch electrode TE2 may electrically contact the first touch electrode TE1 through the contact hole CNT. Accordingly, the touch electrode including the first touch electrode TE1 and the second touch electrode TE2 may be formed.

The reflective pattern RP may be disposed in the trench TC defined in the touch insulating layer 160. In such an embodiment, the reflective pattern RP may overlap each of the first light emitting device LED1 and the second light emitting device LED3.

The second touch electrode TE2 and the reflective pattern RP may be formed together in a same process. Accordingly, the second touch electrode TE2 and the reflective pattern RP may include a same material as each other. In an embodiment, for example, materials of the second touch electrode TE2 and the reflective pattern RP may include silver (Ag), an alloy containing silver, molybdenum (Mo), an alloy containing molybdenum, and aluminum (Al), alloys containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

In an embodiment, the second touch electrode TE2 and the reflective pattern RP may have a multi-layer structure in which a plurality of metal layers are stacked. In an embodiment, for example, the second touch electrode TE2 and the reflective pattern RP may have a two-layer structure of titanium (Ti)/aluminum (Al), a two-layer structure of aluminum (Al)/molybdenum (Mo), a two-layer structure of (Ti)/copper (Cu), or the like.

Figure 8:
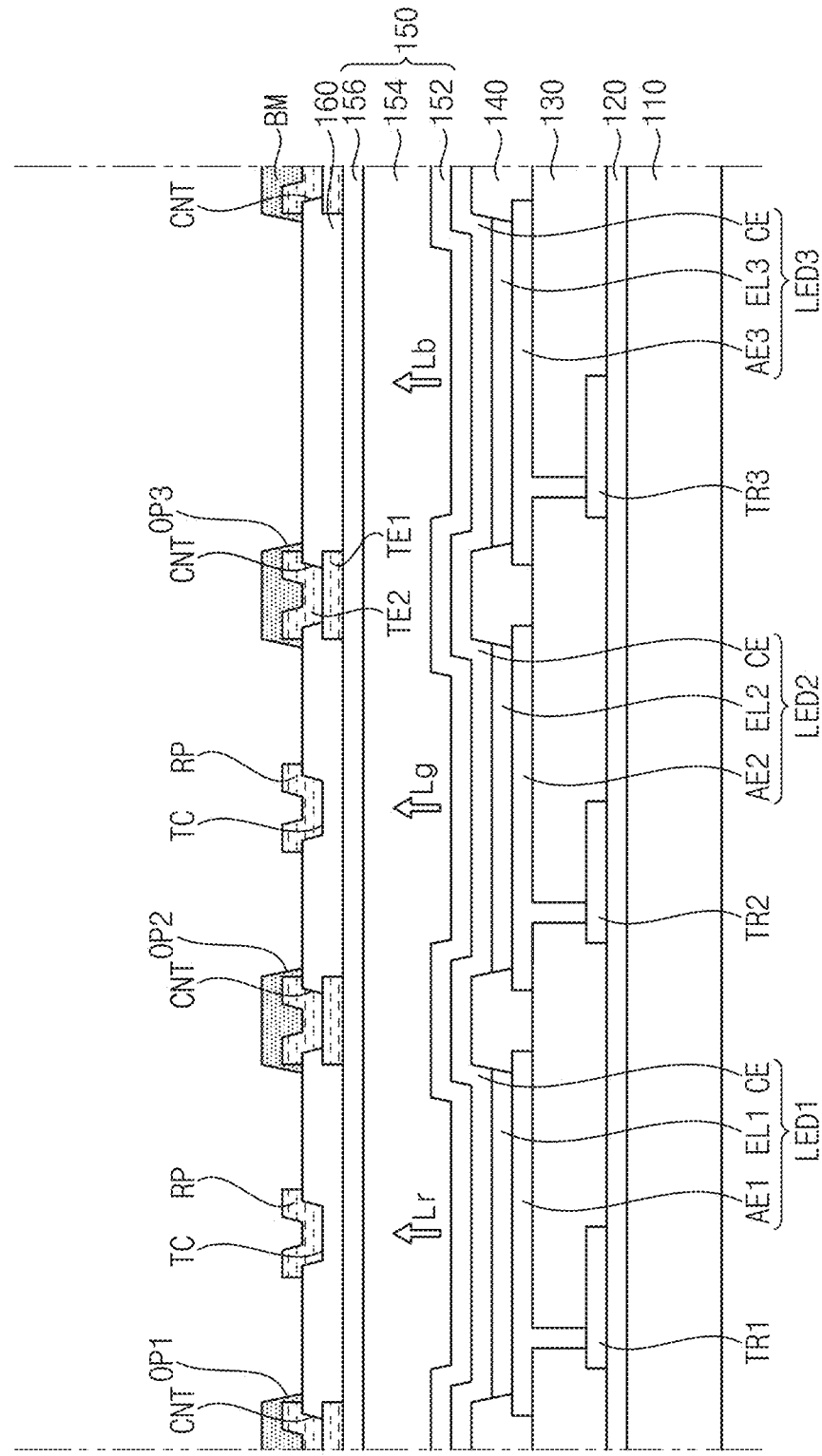

Referring to FIG. 8, the light blocking member BM may be formed on the touch insulating layer 160. The light blocking member BM may be disposed to overlap the pixel defining layer 140 and the touch electrode. The light blocking member BM may cover the second touch electrode TE2. The light blocking member BM may define a plurality of openings exposing a portion of the touch insulating layer 160. In an embodiment, for example, the light blocking member BM may include the first opening OP1 corresponding to the first light emitting device LED1, the second opening OP2 corresponding to the second light emitting device LED2, and the third opening OP3 corresponding to the third light emitting device LED3. In such an embodiment, the first opening OP1 and the second opening OP2 may also expose the reflective pattern RP.

Figure 9:
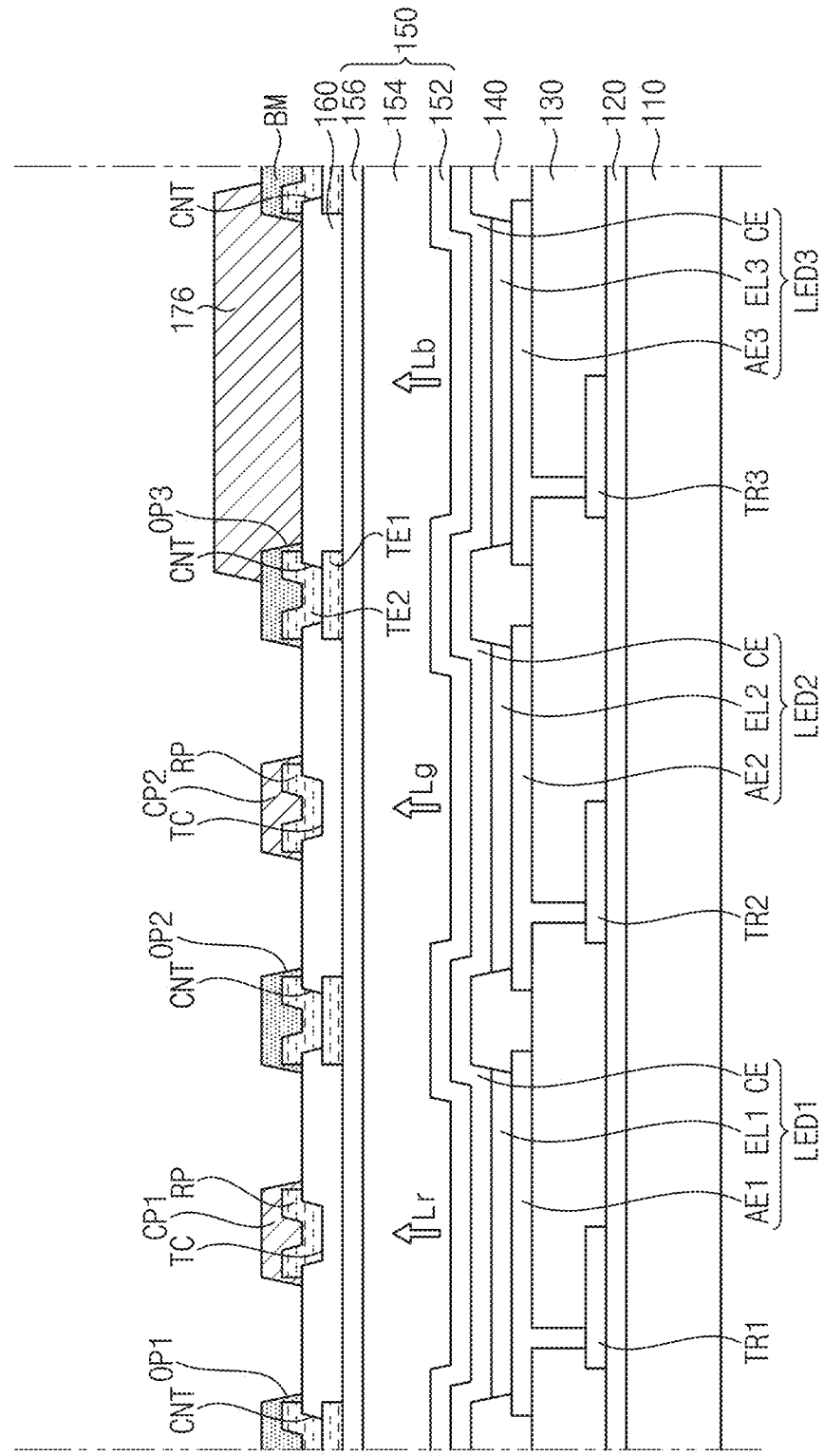

Referring to FIG. 9, the first color pattern CP1, the second color pattern CP2, and the third color filter 176 may be formed on the touch insulating layer 160.

In an embodiment, the first color pattern CP1 may be disposed in the first opening OP1 and cover the reflective pattern RP exposed by the first opening OP1. In an embodiment, the first color pattern CP1 may overlap the first light emitting device LED1. The second color pattern CP2 may be disposed in the second opening OP2 and cover the reflective pattern RP exposed by the second opening OP2. In an embodiment, the second color pattern CP2 may overlap the second light emitting device LED2. The third color filter 176 may be disposed in the third opening OP3. In an embodiment, the third color filter 176 may overlap the third light emitting device LED3.

In an embodiment, the first color pattern CP1, the second color pattern CP2, and the third color filter 176 may be formed together in a same process. In an embodiment, for example, the first color pattern CP1, the second color pattern CP2, and the third color filter 176 may be formed in the same process by applying a photoresist composition on the touch insulating layer 160 and the light blocking member BM and selectively radiating a light to areas corresponding to each of the first color pattern CP1, the second color pattern CP2, and the third color filter 176 using an exposure mask. However, the invention is not necessarily limited thereto.

For example, in an alternative embodiment, the first color pattern CP1, the second color pattern CP2, and the third color filter 176 may be formed in a same process by selectively not radiating a light to areas corresponding to each of the first color pattern CP1, the second color pattern CP2, and the third color filter 176 (that is, radiating a light to areas other than the areas corresponding to each of the first color pattern CP1, the second color pattern CP2, and the third color filter 176) using an exposure mask or by radiating a light with different exposure amounts to areas corresponding to the first color pattern CP1, the second color pattern CP2, and the third color filter 176, respectively. In addition, each of the first color pattern CP1 and the second color pattern CP2 may be formed in a separate process from the third color filter 176.

In an embodiment, the first color pattern CP1, the second color pattern CP2, and the third color filter 176 may include a same material as each other. In an embodiment, for example, the third light emitting device LED3 may emit a blue light Lb, the third color filter 176 may be a blue color filter that selectively transmits the blue light Lb, and the first color pattern CP1, the second color pattern CP2, and the third color filter 176 may include a dye and/or a pigment that absorb light of a color other than blue.

Figure 10:
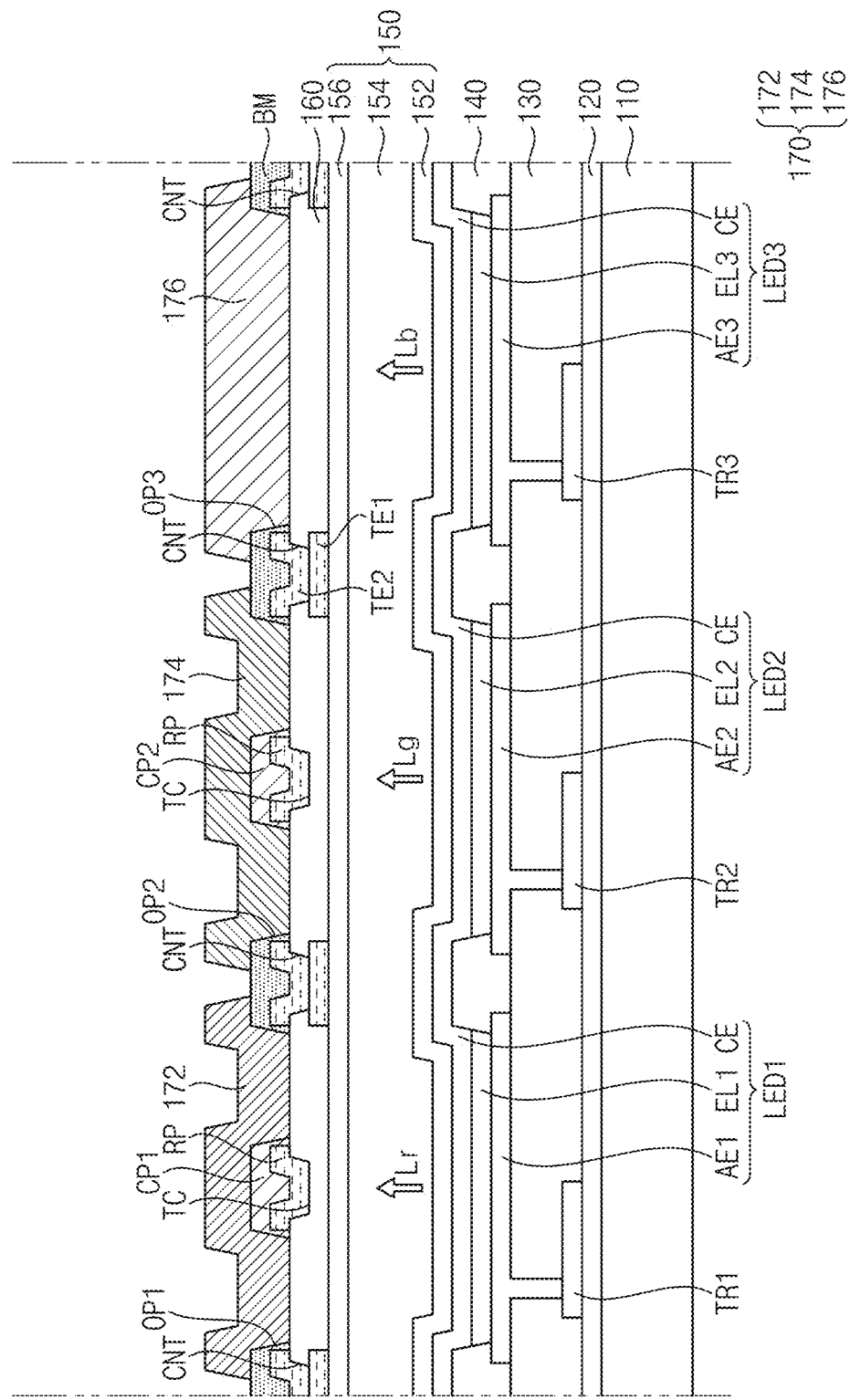

Referring to FIG. 10, the first color filter 172 and the second color filter 174 may be formed on the touch insulating layer 160. Accordingly, the color filter layer 170 including the first color filter 172, the second color filter 174, and the third color filter 176 may be formed.

In an embodiment, the first color filter 172 may be disposed in the first opening OP1 and cover the first color pattern CP1. In such an embodiment, the first color filter 172 may overlap the first light emitting device LED1. The second color filter 174 may be disposed in the second opening OP2 and cover the second color pattern CP2. In such an embodiment, the second color pattern CP2 may overlap the second light emitting device LED2. Accordingly, the first color pattern CP1 may overlap a portion of the first color filter 172 and the second color pattern CP2 may overlap a portion of the second color filter 174.

In an embodiment, the first light emitting device LED1 may emit a red light Lr, the second light emitting device LED2 may emit a green light Lg, the first color filter 172 may be a red color filter that selectively transmits the red light Lr, and the second color filter 174 may be a green color filter that selectively transmits the green light Lg. In such an embodiment, the first color filter 172 may include a dye and/or a pigment that absorb light of colors other than red, and the second color filter 174 may include a dye and/or a pigment that absorb light of colors other than green.

Thereafter, as shown in FIG. 3, the overcoat layer 180 may be formed on the light blocking member BM and the color filter layer 170, and the window 190 may be formed on the overcoat layer 180.

FIGS. 11 to 17 are cross-sectional views illustrating display devices according to alternative embodiments.

Particularly, FIGS. 11 to 17 may each correspond to the cross-sectional view of FIG. 3. Hereinafter, display devices according to various embodiments of the invention will be described with reference to FIGS. 11 to 17. In the following description, differences from the display device described with reference to FIG. 3 will be mainly described, and any repetitive detailed descriptions of the same or like elements as those described above will be omitted or simplified.

Figure 11:
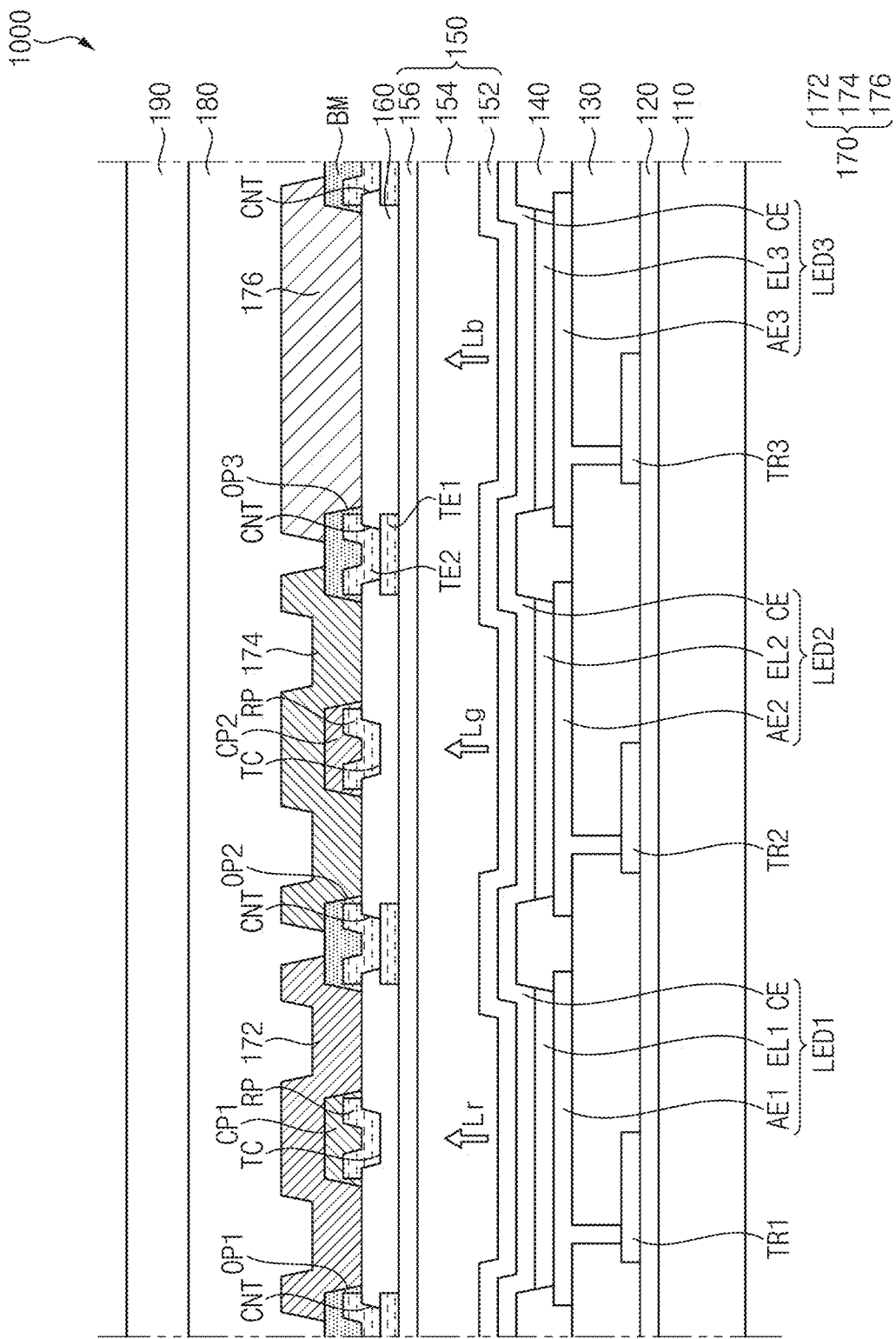
FIGS. 11 to 17 are cross-sectional views illustrating display devices according to alternative embodiments.

Referring to FIG. 11, in an embodiment, the first color pattern CP1 may include a same material as the second color filter 174 and the second color pattern CP2 may include a same material as the first color filter 172.

In an embodiment, for example, the first color filter 172 may be a red color filter that selectively transmits a red light Lr, the second color filter 174 may be a green color filter that selectively transmits a green light Lg, the first color pattern CP1 may include a dye and/or a pigment that absorb light of colors other than green, and the second color pattern CP2 may include a dye and/or a pigment that absorb light of colors other than red.

Figure 12:
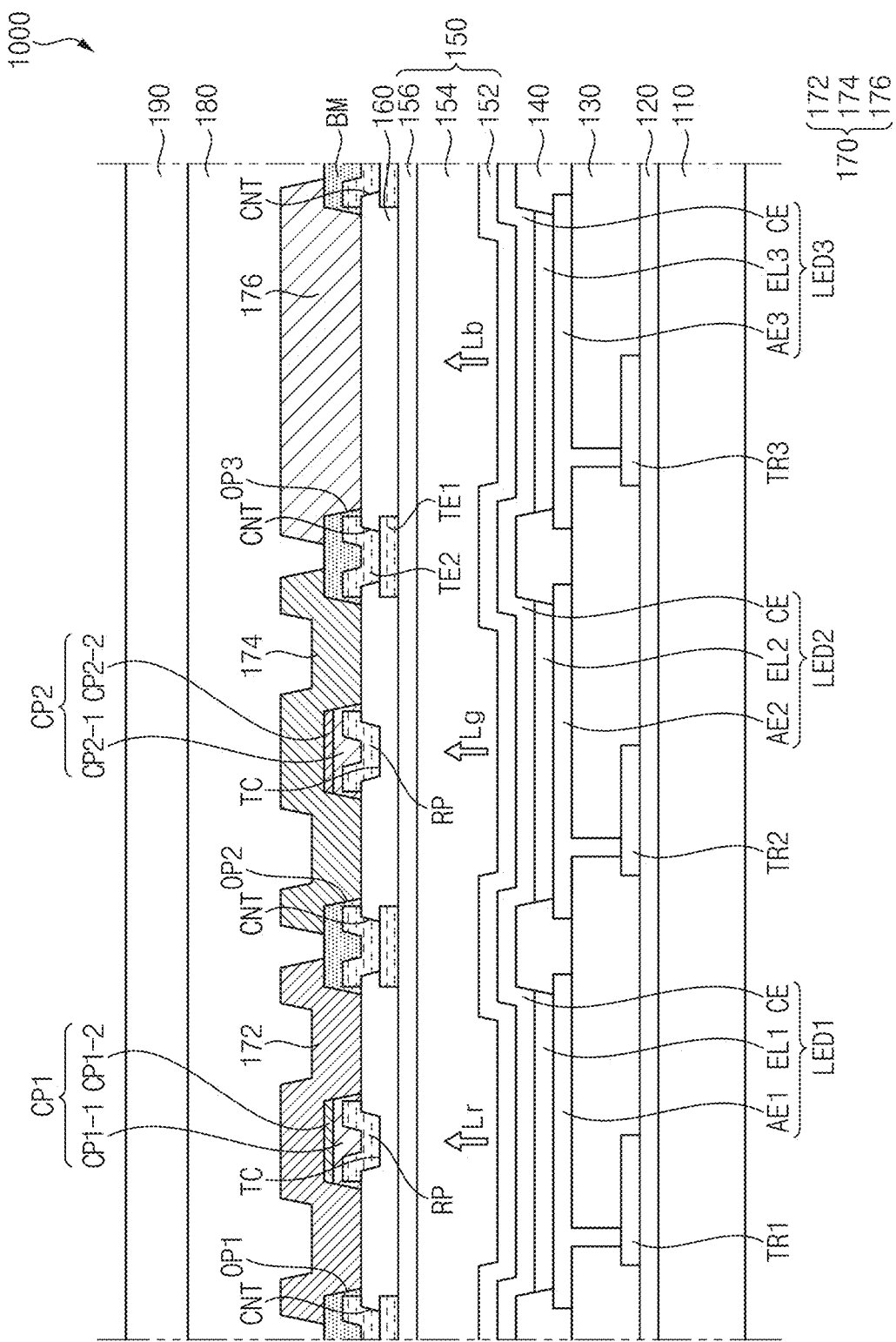

Referring to FIG. 12, in an embodiment, each of the first color pattern CP1 and the second color pattern CP2 may have a multi-layer structure.

In such an embodiment, as shown in FIG. 12, the first color pattern CP1 may include a first lower color pattern CP1-1 and a first upper color pattern CP1-2 disposed on the first lower color pattern CP1-1. In such an embodiment, one of the first lower color pattern CP1-1 and the first upper color pattern CP1-2 may include a same material as the third color filter 176 and the other of the first lower color pattern CP1-1 and the first upper color pattern CP1-2 may include a same material as the second color filter 174. In an embodiment, for example, the first lower color pattern CP1-1 may include a same material as the third color filter 176 and the first upper color pattern CP1-2 may include a same material as the second color filter 174.

In such an embodiment, the second color pattern CP2 may include a second lower color pattern CP2-1 and a second upper color pattern CP2-2 disposed on the second lower color pattern CP2-1. In such an embodiment, one of the second lower color pattern CP2-1 and the second upper color pattern CP2-2 may include a same material as the third color filter 176 and the other of the second lower color pattern CP2-1 and the second upper color pattern CP2-2 may include a same material as the first color filter 172. In an embodiment, for example, the second lower color pattern CP2-1 may include a same material as the third color filter 176 and the second upper color pattern CP2-2 may include a same material as the first color filter 172.

Also, although not shown, in an alternative embodiment, one of the first color pattern CP1 and the second color pattern CP2 may have a multi-layer structure and the other of the first color pattern CP1 and the second color pattern CP2 may have a single-layer structure.

In such an embodiment, where the first color pattern CP1 and the second color pattern CP2 have a multi-layer structure, a reflective color of the display device 1000 may be further improved.

Figure 13:
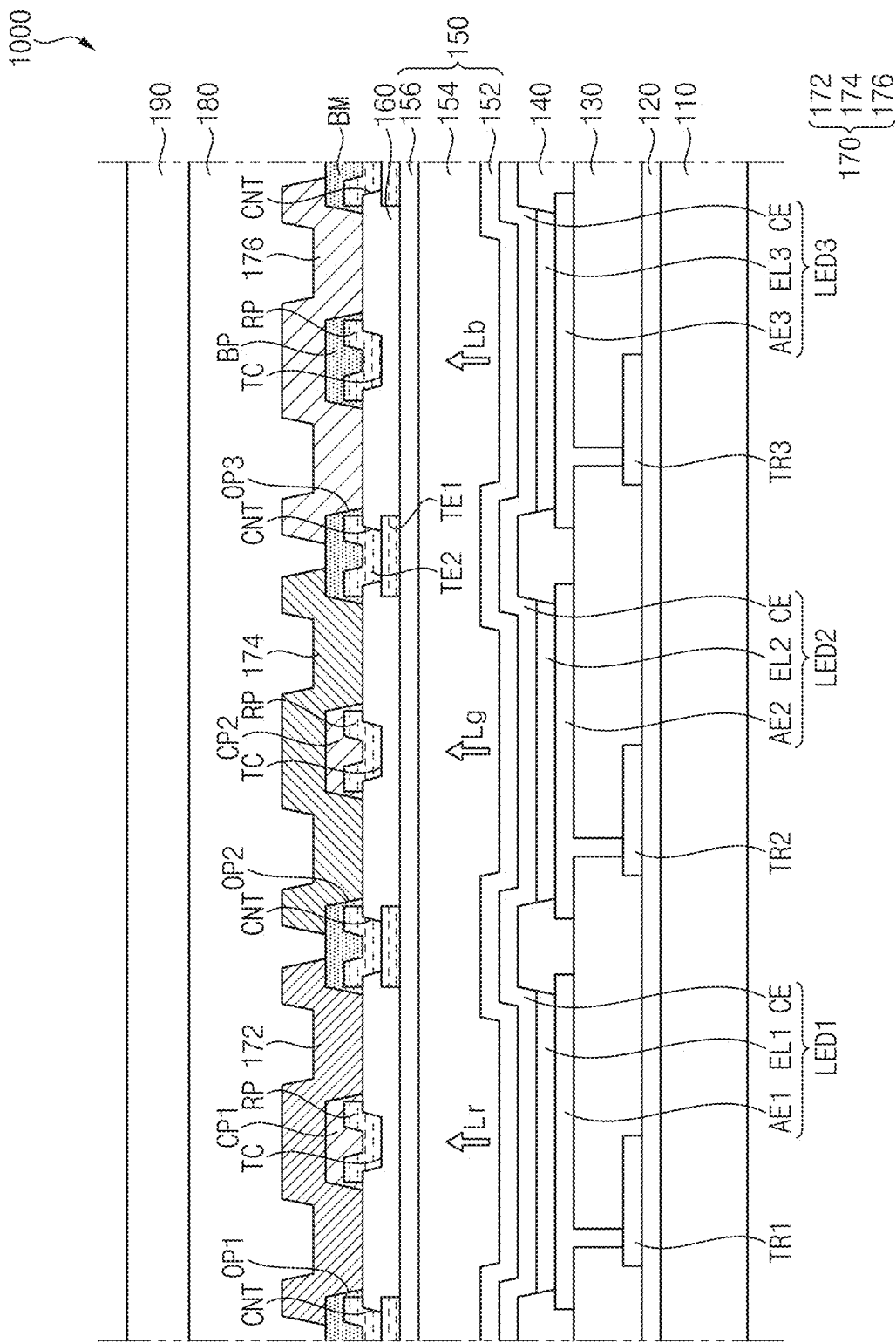
Figure 14:
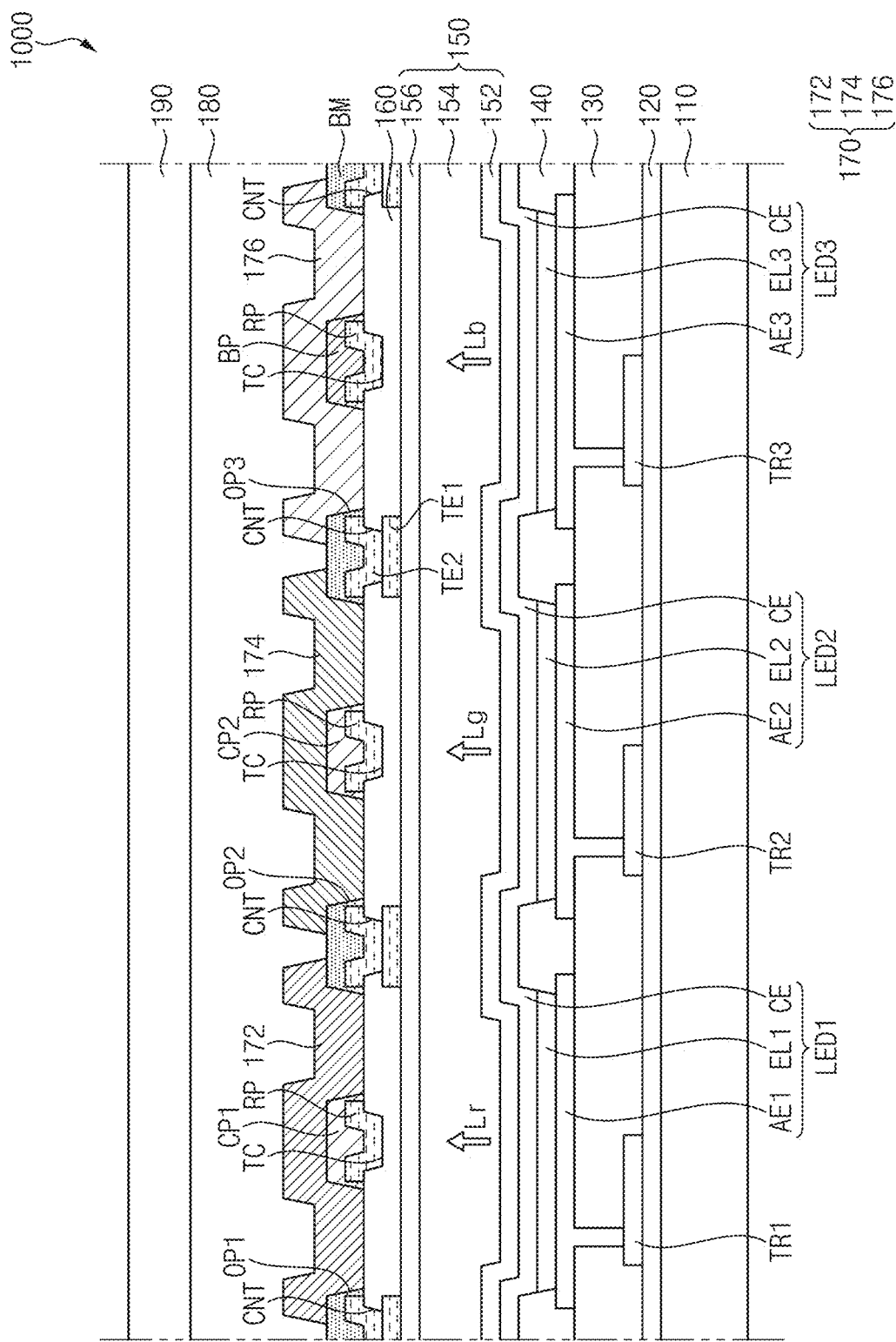
Figure 15:
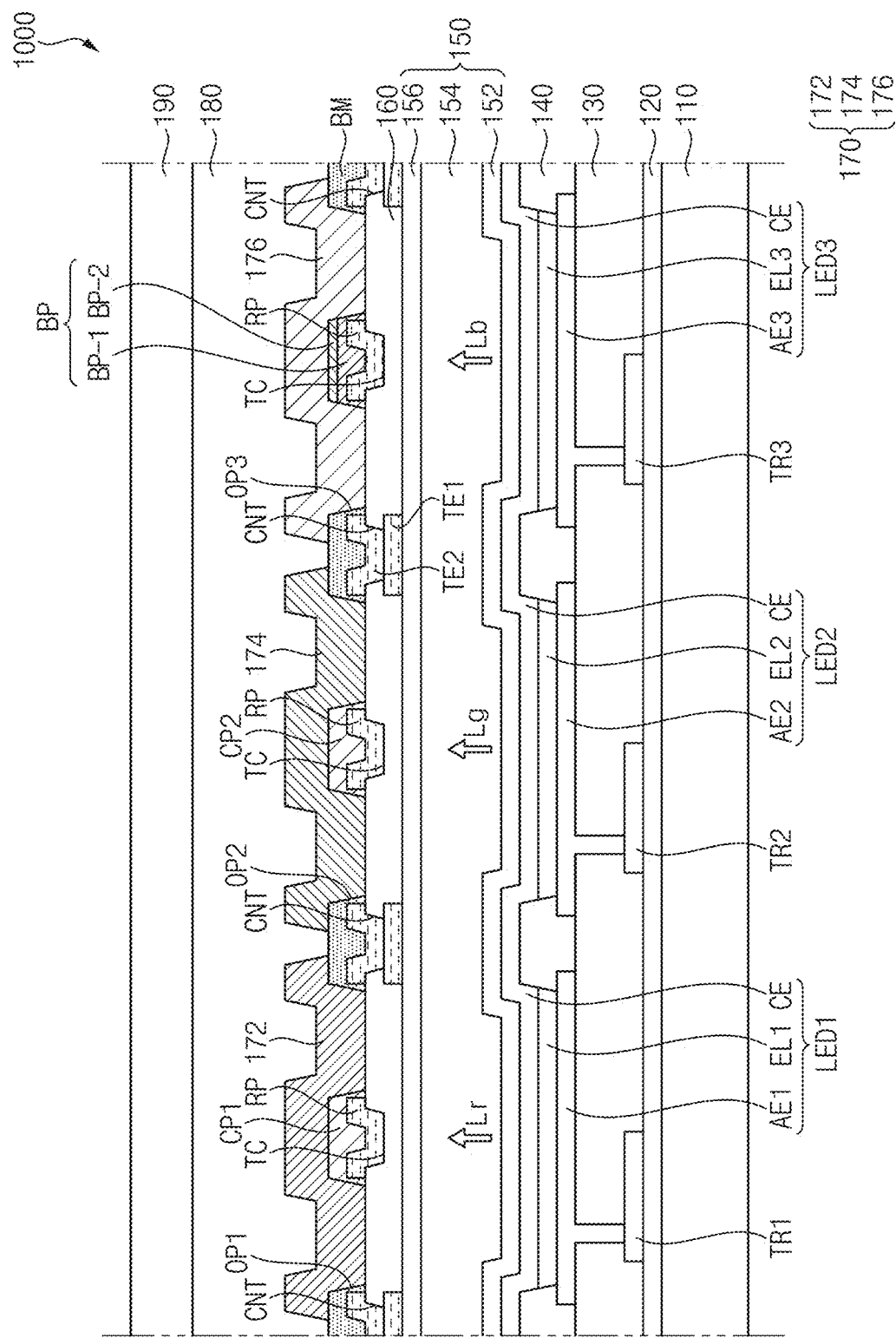

Referring to FIGS. 13 to 15, in an embodiment, the display device 1000 may further include a light blocking pattern BP disposed on the touch insulating layer 160. The light blocking pattern BP may be disposed in the third opening OP3 defined by the light blocking member BM and covered by the third color filter 176. In such an embodiment where the display device 1000 further includes the light blocking pattern BP, a reflectance of external light of the display device 1000 may be further reduced.

In an embodiment where the display device 1000 further includes the light blocking pattern BP, the trench TC of the touch insulating layer 160 may be defined to overlap the third light emitting device LED3, and the reflective pattern RP may be disposed in the trench TC overlapping the third light emitting device LED3 to overlap the third light emitting device LED3. In such an embodiment, the third opening OP3 may expose the reflective pattern RP overlapping the third light emitting device LED3. In an embodiment, the light blocking pattern BP may cover the reflective pattern RP exposed through the third opening OP3. In such an embodiment, the light blocking pattern BP may overlap the reflective pattern RP exposed by the third opening OP3 and the third light emitting device LED3.

In an embodiment, the planar shape of the light blocking pattern BP may be circular. However, the invention is not necessarily limited thereto, and in an alternative embodiment, the planar shape of the light blocking pattern BP may be elliptical, polygonal, rhombic, or track-shaped.

In an embodiment, as shown in FIGS. 13 to 15, a cross-sectional shape of the light blocking pattern BP may be a tapered shape, but the invention is not necessarily limited thereto, and in an alternative embodiment, the cross-sectional shape of the light blocking pattern BP may be rectangular.

As shown in FIG. 13, in an embodiment, the light blocking pattern BP may include a same material as the light blocking member BM. In an embodiment, for example, examples of materials that can be used as the light blocking pattern BP may include chromium (Cr), chromium oxide (CrOx), chromium nitride (CrNx), carbon black, a black pigment mixture, a black dye mixture, or the like. These may be used alone or in combination with each other.

In an embodiment, the light blocking pattern BP may be together formed with the light blocking member BM. In an embodiment, for example, the light blocking pattern BP and the light blocking member BM may be formed in a same process by coating a photoresist composition on the touch insulating layer 160 and selectively radiating a light to areas corresponding to each of the light blocking pattern BP and the light blocking member BM using an exposure mask. However, the invention is not necessarily limited thereto.

For example, in an alternative embodiment, the light blocking pattern BP and the light blocking member BM may be formed in a same process by selectively not radiating a light to areas corresponding to each of the light blocking pattern BP and the light blocking member BM using an exposure mask or by radiating a light with different exposure amounts to areas corresponding to the light blocking pattern BP and the light blocking member BM, respectively.

As shown in FIG. 14, in an embodiment, the light blocking pattern BP may include a same material as the first color filter 172. In an embodiment, for example, the first light emitting device LED1 may emit a red light Lr, the first color filter 172 may be a red color filter that selectively transmits the red light Lr, and the light blocking pattern BP may include a dye and/or a pigment that absorb light of colors other than red.

Also, although not shown, the light blocking pattern BP may include a same material as the second color filter 174. In an embodiment, for example, the second light emitting device LED2 may emit a green light Lg, the second color filter 174 may be a green color filter that selectively transmits the green light Lg, and the light blocking pattern BP may include a dye and/or a pigment that absorb light of colors other than green.

In an embodiment where the light blocking pattern BP includes a same material as the first color filter 172 or a same material as the second color filter 174, a reflective color of the display device 1000 may be further improved.

As shown in FIG. 15, in an embodiment, the light blocking pattern BP may have a multi-layer structure. In an embodiment, for example, the light blocking pattern BP may include a lower light blocking pattern BP-1 and an upper light blocking pattern BP-2 disposed on the lower light blocking pattern BP-1. In such an embodiment, one of the lower light blocking pattern BP-1 and the upper light blocking pattern BP-2 may include a same material as the first color filter 172, and the other of the lower light blocking pattern BP-1 and the upper light blocking pattern BP-2 may include a same material as the second color filter 174. In such an embodiment where the light blocking pattern BP has a multi-layer structure, a reflective color of the display device 1000 may be further improved.

Figure 16:
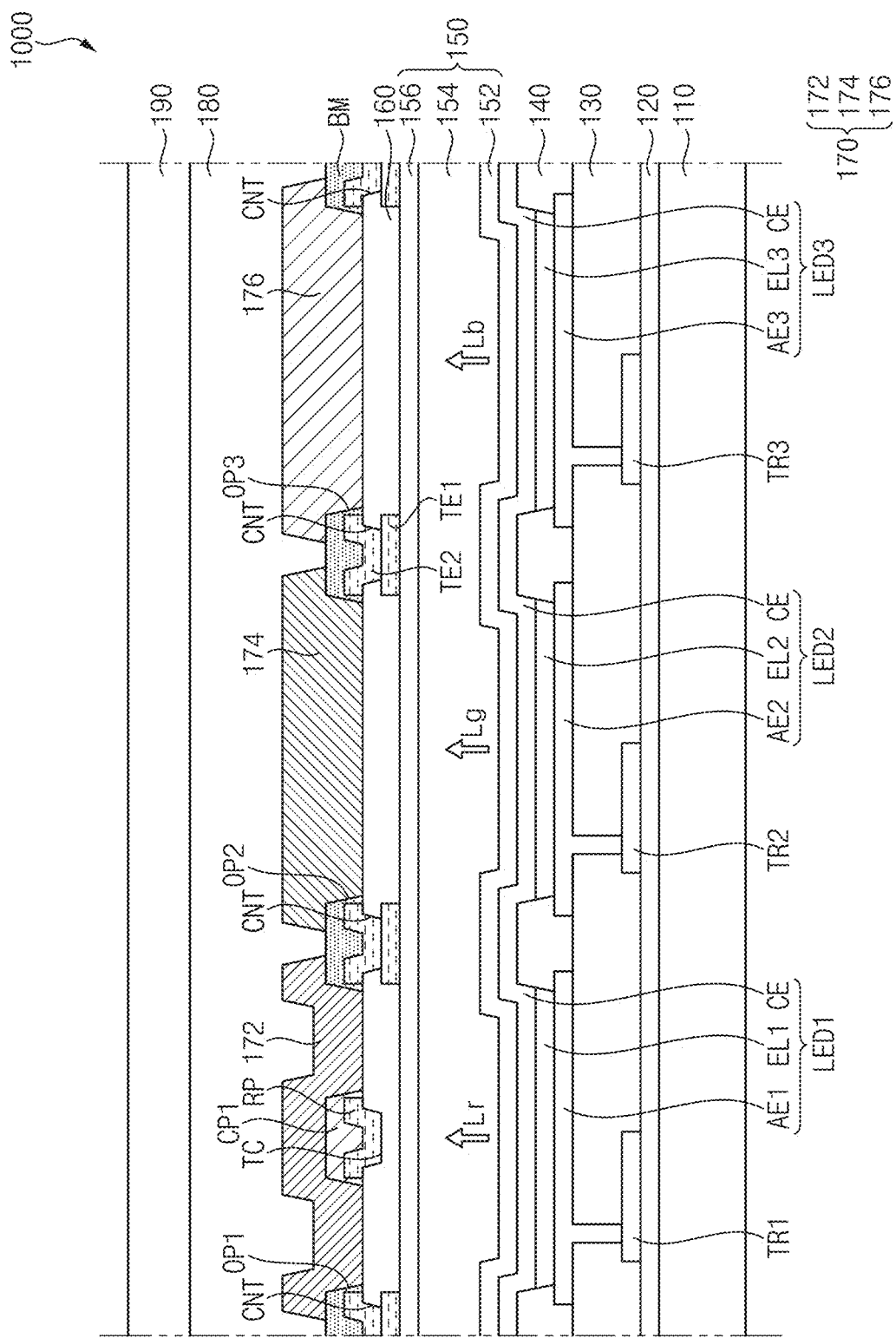
Figure 17:
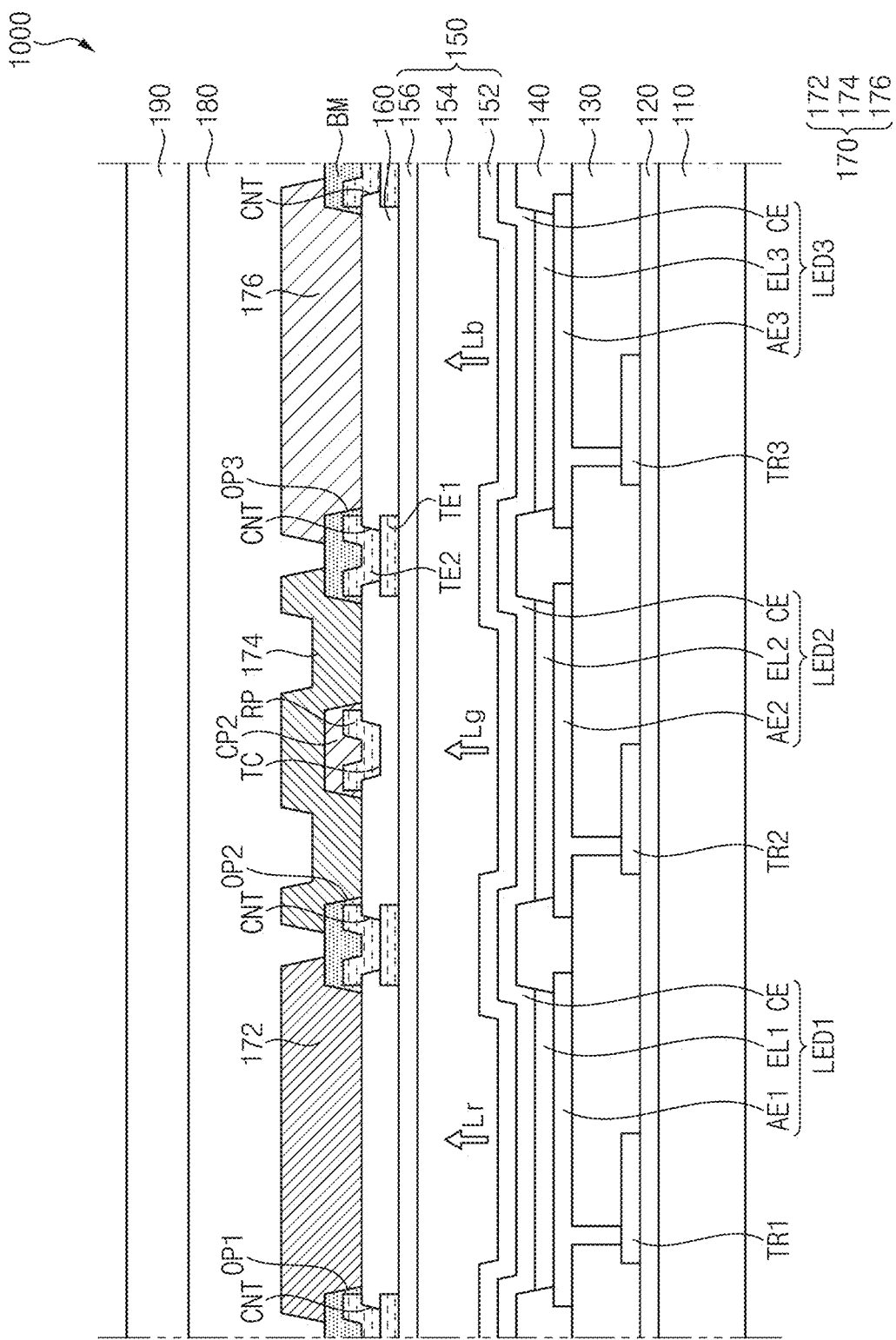

Referring to FIGS. 16 and 17, one of the first color pattern CP1 or the second color pattern CP2 may be omitted. In an embodiment, for example, as shown in FIG. 16, the second color pattern CP2 may be omitted. In such an embodiment, the trench TC and the reflective pattern RP overlapping the second light emitting device LED2 may also be omitted. In an alternative embodiment, as shown in FIG. 17, the first color pattern CP1 may be omitted. In such an embodiment, the trench TC and the reflective pattern RP overlapping the first light emitting element LED1 may also be omitted. In an embodiment where one of the first color pattern CP1 and the second color pattern CP2 is omitted, a reflective color of the display device 1000 may be further improved.

Also, although both the first color pattern CP1 and the second color pattern CP2 include a same material as the third color filter 176 in FIGS. 16 and 17, the invention is not necessarily limited thereto. In an embodiment, for example, even if one of the first color pattern CP1 and the second color pattern CP2 is omitted, as described with reference to FIG. 11, the first color pattern CP1 may include a same material as the second color filter 174 and the second color pattern CP2 may include a same material as the first color filter 172.

Also, although both the first color pattern CP1 and the second color pattern CP2 have a single-layer structure in FIGS. 16 and 17, the invention is not necessarily limited thereto. In an alternative embodiment, for example, even if one of the first color pattern CP1 and the second color pattern CP2 is omitted, as described with reference to FIG. 12, each of the first color pattern CP1 and the second color pattern CP2 may have a multi-layer structure.

Also, although the light blocking pattern BP is omitted in the third opening OP in FIGS. 16 and 17, the invention is not necessarily limited thereto. In an embodiment, for example, even if one of the first color pattern CP1 and the second color pattern CP2 is omitted, as described with reference to FIGS. 13 to 15, the light blocking pattern BP may be disposed in the third opening OP3.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate;
   a first light emitting device, a second light emitting device and a third light emitting device, which are disposed on the substrate and spaced apart from each other;
   an encapsulation layer covering the first light emitting device, the second light emitting device and the third light emitting device;
   a light blocking member disposed on the encapsulation layer, wherein the light blocking member defines a first opening corresponding to the first light emitting device, a second opening corresponding to the second light emitting device, and a third opening corresponding to the third light emitting device;
   a color filter layer including a first color filter disposed in the first opening, a second color filter disposed in the second opening, and a third color filter disposed in the third opening;
   a first color pattern disposed in the first opening and covered by the first color filter, wherein the first color pattern includes at least one selected from a same material as the second color filter and a same material as the third color filter; and
   a second color pattern disposed in the second opening and covered by the second color filter, wherein the second color pattern includes at least one selected from a same material as the first color filter and the same material as the third color filter.

2. The display device of claim 1, wherein
   the first color filter is a red color filter which selectively transmits a red light,
   the second color filter is a green color filter which selectively transmits a green light, and
   the third color filter is a blue color filter which selectively transmits a blue light.

3. The display device of claim 1, wherein a planar shape of each of the first color pattern and the second color pattern is circular, elliptical, polygonal, rhombic, or track-shaped.

4. The display device of claim 1, wherein
   the first color pattern includes a lower color pattern and an upper color pattern disposed on the lower color pattern,
   one of the lower color pattern and the upper color pattern includes the same material as the third color filter, and
   the other of the lower color pattern and the upper color pattern includes the same material as the second color filter.

5. The display device of claim 1, wherein
   the second color pattern includes a lower color pattern and an upper color pattern disposed on the lower color pattern,
   one of the lower color pattern and the upper color pattern includes the same material as the third color filter, and
   the other of the lower color pattern and the upper color pattern includes the same material as the first color filter.

6. The display device of claim 1, further comprising:
   a light blocking pattern disposed in the third opening and covered by the third color filter.

7. The display device of claim 6, wherein the light blocking pattern includes a same material as the light blocking member.

8. The display device of claim 6, wherein the light blocking pattern includes at least one selected from the same material as the first color filter and the same material as the second color filter.

9. The display device of claim 8, wherein
   the light blocking pattern includes a lower light blocking pattern and an upper light blocking pattern disposed on the lower light blocking pattern,
   one of the lower light blocking pattern and the upper light blocking pattern includes the same material as the first color filter, and
   the other of the lower light blocking pattern and the upper light blocking pattern includes the same material as the second color filter.

10. The display device of claim 1, further comprising:
    a first touch electrode disposed on the encapsulation layer;
    a touch insulating layer covering the first touch electrode, wherein a trench is defined on the touch insulating layer to overlap the first color pattern and the second color pattern;
    a second touch electrode disposed on the touch insulating layer and overlapping the first touch electrode; and
    a reflective pattern disposed in the trench of the touch insulating layer and overlapping the first color pattern and the second color pattern.

11. The display device of claim 10, wherein the reflective pattern includes a same material as the second touch electrode.

12. A display device comprising:
    a substrate;
    a first light emitting device, a second light emitting device and a third light emitting device, which are disposed on the substrate and spaced apart from each other;
    an encapsulation layer covering the first light emitting device, the second light emitting device and the third light emitting device;
    a light blocking member disposed on the encapsulation layer, wherein the light blocking member defines a first opening corresponding to the first light emitting device, a second opening corresponding to the second light emitting device, and a third opening corresponding to the third light emitting device;

a color filter layer including a first color filter disposed in the first opening, a second color filter disposed in the second opening, and a third color filter disposed in the third opening; and a color pattern disposed in the first opening and covered by the first color filter, wherein the color pattern includes at least one selected from a same material as the second color filter and a same material as the third color filter.

13. The display device of claim 12, wherein one of the first color filter and the second color filter is a red color filter which selectively transmits a red light, the other of the first color filter and the second color filter is a green color filter which selectively transmits a green light, and the third color filter is a blue color filter which selectively transmits a blue light.

14. The display device of claim 12, wherein a planar shape of the color pattern is circular, elliptical, polygonal, rhombic, or track-shaped.

15. The display device of claim 12, wherein the color pattern includes a lower color pattern and an upper color pattern disposed on the lower color pattern, ad one of the lower color pattern and the upper color pattern includes the same material as the third color filter, and the other of the lower color pattern and the upper color pattern includes the same material as the second color filter.

16. The display device of claim 12, further comprising:
a light blocking pattern disposed in the third opening and covered by the third color filter.

17. The display device of claim 16, wherein the light blocking pattern includes a same material as the light blocking member.

18. The display device of claim 16, wherein the light blocking pattern includes at least one selected from the same material as the first color filter and the same material as the second color filter.

19. The display device of claim 18, wherein the light blocking pattern includes a lower light blocking pattern and an upper light blocking pattern disposed on the lower light blocking pattern, one of the lower light blocking pattern and the upper light blocking pattern includes the same material as the first color filter, and the other of the lower light blocking pattern and the upper light blocking pattern includes the same material as the second color filter.

20. The display device of claim 12, further comprising:
a first touch electrode disposed on the encapsulation layer;
a touch insulating layer covering the first touch electrode, wherein a trench is defined on the touch insulating layer to overlap the color pattern;
a second touch electrode disposed on the touch insulating layer and overlapping the first touch electrode; and
a reflective pattern disposed in the trench of the touch insulating layer and overlapping the color pattern, wherein the reflective pattern includes a same material as the second touch electrode.

* * * * *